(12) United States Patent
Kim et al.

(10) Patent No.: US 12,506,047 B2
(45) Date of Patent: Dec. 23, 2025

(54) SEMICONDUCTOR PACKAGE AND COOLING SYSTEM

(71) Applicant: SAMSUNG ELECTRONICS CO., LTD., Suwon-si (KR)

(72) Inventors: Jaechoon Kim, Incheon (KR);
Taehwan Kim, Hwaseong-si (KR);
Seunggeol Ryu, Seoul (KR);
Eungchang Lee, Hanam-si (KR);
Kiwook Jung, Suwon-si (KR);
Sungeun Jo, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 590 days.

(21) Appl. No.: 17/961,371

(22) Filed: Oct. 6, 2022

(65) Prior Publication Data
US 2023/0124783 A1 Apr. 20, 2023

(30) Foreign Application Priority Data
Oct. 14, 2021 (KR) .................. 10-2021-0136890

(51) Int. Cl.
*H01L 23/48* (2006.01)
*H01L 21/48* (2006.01)
(Continued)

(52) U.S. Cl.
CPC ........ *H01L 23/473* (2013.01); *H01L 21/4882* (2013.01); *H01L 23/293* (2013.01);
(Continued)

(58) Field of Classification Search
CPC .................. H01L 23/473; H01L 21/4882
See application file for complete search history.

(56) References Cited

U.S. PATENT DOCUMENTS

| 4,977,443 A | 12/1990 | Kobayashi et al. |
| 6,775,137 B2 | 8/2004 | Chu et al. |
| (Continued) | | |

FOREIGN PATENT DOCUMENTS

| JP | H05-067712 A | 3/1993 |
| JP | H06-036421 B2 | 5/1994 |
| (Continued) | | |

OTHER PUBLICATIONS

Office Action in Taiwanese Appln. No. 111138530, mailed on Mar. 12, 2024, 17 pages (with English translation).
(Continued)

*Primary Examiner* — Nicholas J Tobergte
(74) *Attorney, Agent, or Firm* — Fish & Richardson P.C.

(57) ABSTRACT

A semiconductor package includes; a package substrate, an interposer disposed on the package substrate, semiconductor chips mounted on the interposer, a molding member on the interposer and surrounding the semiconductor chips, a first sealing member on the molding member, and a heat dissipation member on the package substrate and covering the interposer, the semiconductor chips, and the first sealing member, wherein the heat dissipation member includes a lower structure contacting an upper surface of the package substrate, and an upper structure on the lower structure, extending over the first sealing member, and including a microchannel and a micropillar on the microchannel.

19 Claims, 24 Drawing Sheets

(51) Int. Cl.
  *H01L 23/29* (2006.01)
  *H01L 23/31* (2006.01)
  *H01L 23/473* (2006.01)
  *H01L 25/065* (2023.01)
  *H01L 23/00* (2006.01)
  *H01L 23/498* (2006.01)

(52) U.S. Cl.
  CPC ...... *H01L 23/3128* (2013.01); *H01L 23/3135* (2013.01); *H01L 23/3142* (2013.01); *H01L 25/0652* (2013.01); *H01L 23/49816* (2013.01); *H01L 23/49822* (2013.01); *H01L 23/49833* (2013.01); *H01L 23/49838* (2013.01); *H01L 24/16* (2013.01); *H01L 2224/16148* (2013.01); *H01L 2224/16225* (2013.01); *H01L 2924/1431* (2013.01); *H01L 2924/1434* (2013.01)

(56) References Cited

U.S. PATENT DOCUMENTS

| | | | |
|---|---|---|---|
| 9,357,675 | B2 | 5/2016 | Campbell et al. |
| 10,681,846 | B2 | 6/2020 | Iyengar et al. |
| 10,707,196 | B2 | 7/2020 | Kim et al. |
| 10,943,851 | B1 | 3/2021 | Elsherbini et al. |
| 10,964,624 | B2 | 3/2021 | Gutala et al. |
| 10,964,625 | B2 | 3/2021 | Jain et al. |
| 11,195,816 | B2 * | 12/2021 | Yu .......................... H01L 25/50 |
| 2010/0206537 | A1 * | 8/2010 | Ikeda .................. H01L 23/3677 |
| | | | 165/185 |
| 2020/0176352 | A1 | 6/2020 | Chang et al. |
| 2020/0411439 | A1 * | 12/2020 | Teng ..................... H01L 21/563 |
| 2021/0066164 | A1 | 3/2021 | Wu et al. |

FOREIGN PATENT DOCUMENTS

| | | |
|---|---|---|
| JP | 2001-267485 A | 9/2001 |
| JP | 2005-166752 A | 6/2005 |
| JP | 2021-093515 A | 6/2021 |
| KR | 10-0745534 B1 | 8/2007 |
| KR | 10-2016-0116207 A | 3/2015 |
| KR | 10-2019-0076661 A | 7/2019 |
| TW | 202105663 | 2/2021 |

OTHER PUBLICATIONS

Office Action in Korean Appln. No. 10-2021-0136890, mailed on Aug. 4, 2025, 20 pages (with English translation).

* cited by examiner

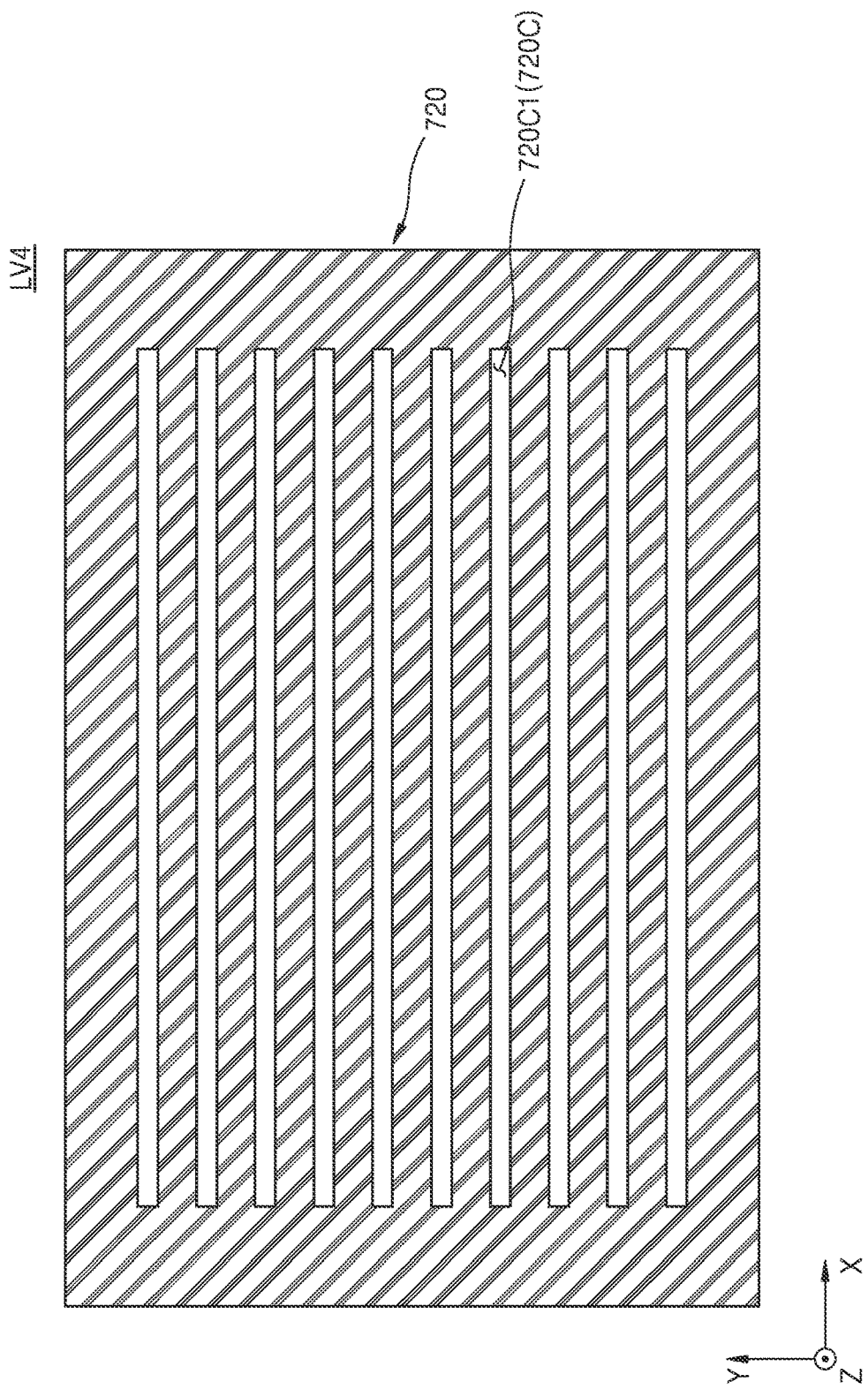

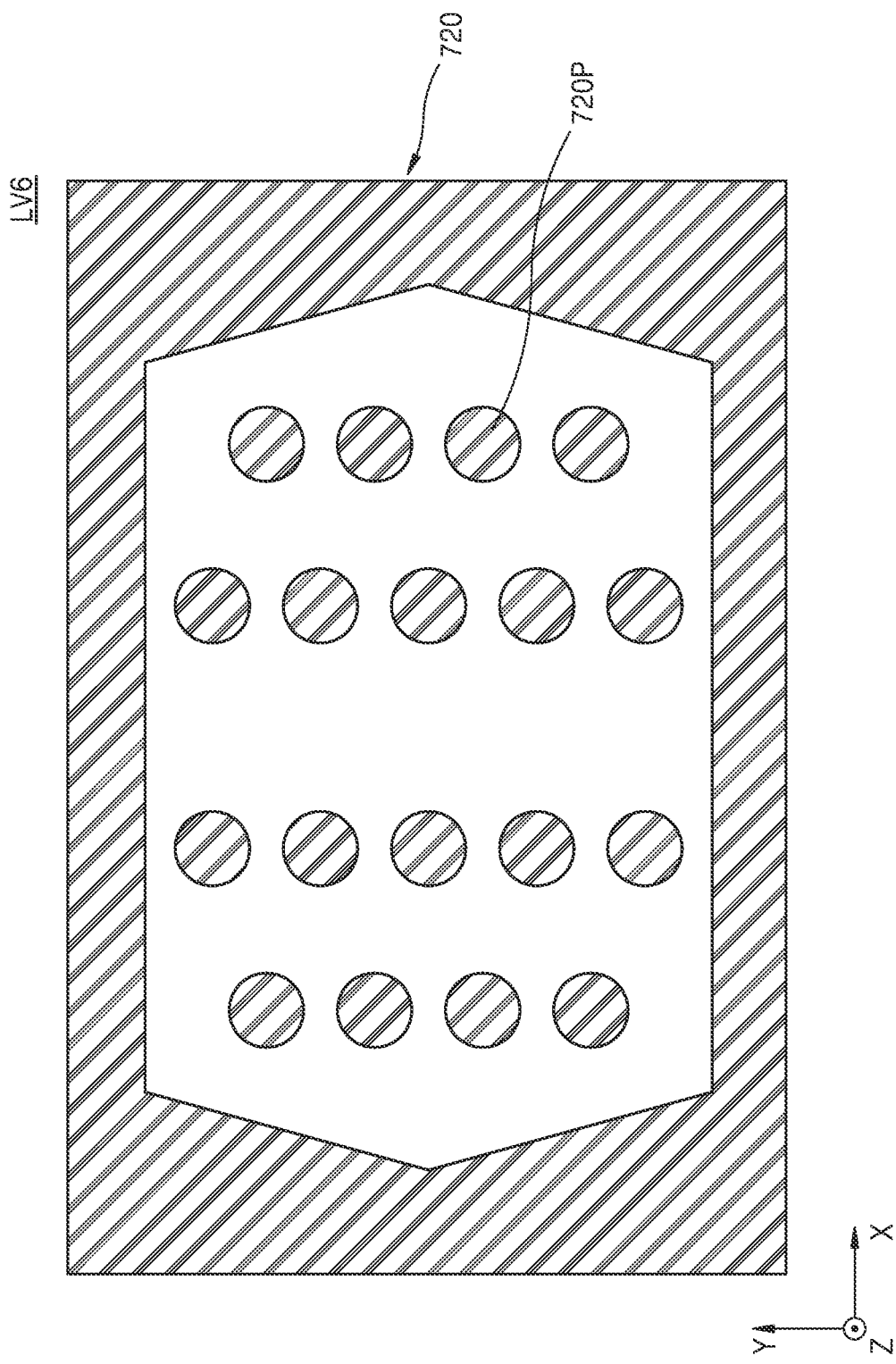

SEMICONDUCTOR PACKAGE AND COOLING SYSTEM

CROSS-REFERENCE TO RELATED APPLICATION

This application claims priority under 35 U.S.C. § 119 to Korean Patent Application No. 10-2021-0136890 filed on Oct. 14, 2021 in the Korean Intellectual Property Office, the subject matter of which is hereby incorporated by reference in its entirety.

BACKGROUND

The inventive concept relates to semiconductor packages and cooling systems for semiconductor packages. More particularly, the inventive concept relates to system-in-package devices including different types of semiconductor chips disposed in a single semiconductor and cooling system for same.

The evolution of electronic products, particularly portable electronic devices, is one characterized by expanded functionality and reductions in physical size and weight. These market (or consumer) drivers place considerable demands on the constituent components of contemporary and emerging electronic components, such as semiconductor devices. That is, in order to achieve expectations for reduced size/weight and expanded functionality, semiconductor devices must provide processing capabilities for large amounts of data with reduced overall size (e.g., volume).

Thus, there is a continuing demand for high integration density and reliable packaging of multiple semiconductor chips within a single semiconductor package. Indeed, it is becoming increasingly necessary in some application to provide an efficient arrangement of semiconductor chips within a limited-size semiconductor package together with a cooling system for the semiconductor package.

SUMMARY

Embodiments of the inventive concept provide semiconductor packages exhibiting improved cooling performance due to use of ultrapure water as coolant. Embodiments of the inventive concept also provide efficient arrangements of semiconductor chips within a limited-size semiconductor package and an improved cooling system for the semiconductor package.

However, the problems addressed by various embodiments of the inventive concept are not limited to only the above-mentioned ones—as will be appreciated by those skilled in the art upon consideration of the following detailed description and claims.

According to an aspect of the inventive concept, a semiconductor package may include; a package substrate, an interposer disposed on the package substrate, semiconductor chips mounted on the interposer, a molding member on the interposer and surrounding the semiconductor chips, a first sealing member on the molding member, and a heat dissipation member on the package substrate and covering the interposer, the semiconductor chips, and the first sealing member, wherein the heat dissipation member includes a lower structure contacting an upper surface of the package substrate, and an upper structure on the lower structure, extending over the first sealing member, and including a microchannel and a micropillar on the microchannel.

According to an aspect of the inventive concept, a semiconductor package may include; a first semiconductor chip and a second semiconductor chip mounted on an interposer, wherein each of the first semiconductor chip and the second semiconductor chip includes an active surface and an inactive surface, a molding member on the interposer and surrounding the first semiconductor chip and the second semiconductor chip, a sealing member on an upper surface of the molding member, disposed along an edge of an inactive surface of the first semiconductor chip, disposed along an edge of an inactive surface of the second semiconductor chip, exposing a first central region of the inactive surface of the first semiconductor chip, and exposing a second central region of the inactive surface of the second semiconductor chip, and a heat dissipation member on the sealing member, covering the molding member, the first semiconductor chip, and the second semiconductor chip, and including a coolant transfer path thermally connected to the first central region and the second central region, wherein the coolant transfer path includes at least one of a microchannel and a micropillar.

According to an aspect of the inventive concept, a semiconductor package may include; a package substrate, an interposer disposed on the package substrate, semiconductor chips mounted on the interposer, a molding member on the interposer and surrounding the semiconductor chips, a sealing member extending along an interface between the molding member and the first semiconductor chips and along an interface between the molding member and the second semiconductor chips, and a heat dissipation member on the package substrate, connected to a cooling system, and covering the interposer, the semiconductor chips, and the sealing member, wherein the heat dissipation member includes; a coolant inlet port exposed through an upper surface of the heat dissipation member, a coolant outlet port exposed through the upper surface of the heat dissipation member, and a coolant transfer path extending between the coolant inlet port and the coolant outlet port and configured to thermally connect a coolant to a central portion of an upper surface of the first semiconductor chip and a central portion of an upper surface of the second semiconductor chip.

According to an aspect of the inventive concept, a method of manufacture for a semiconductor package may include; mounting a first semiconductor chip and a second semiconductor chip to an interposer, mounting the interposer including the first semiconductor chip and a second semiconductor chip to a package substrate, forming a molding member on the interposer to surround the first semiconductor chip and a second semiconductor chip, forming a sealing member on an upper surface of the molding member and on respective upper portions of the first semiconductor chip and a second semiconductor chip, positioning a heat dissipation member on an upper surface of the sealing member to cover the interposer, the first semiconductor chip, the second semiconductor chip, and the molding member, applying pressure to the heat dissipation member in contact with the upper surface of the sealing member, and connecting a cooling system to the heat dissipation member.

BRIEF DESCRIPTION OF THE DRAWINGS

Advantages, benefits, features and related aspects of the inventive concept may be more clearly understood upon consideration of the following detailed description together with the accompanying drawings, in which:

FIGS. 1B, 1C, 1D, 1E, 1F, 1G and 1H (hereafter collectively, "FIGS. 1B to 1F") are respective plan views illustrating different levels of the semiconductor package of FIG. 1A;

DETAILED DESCRIPTION

Throughout the written description and drawings, like reference numbers and labels are used to denote like or similar elements, components, method steps and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1A:
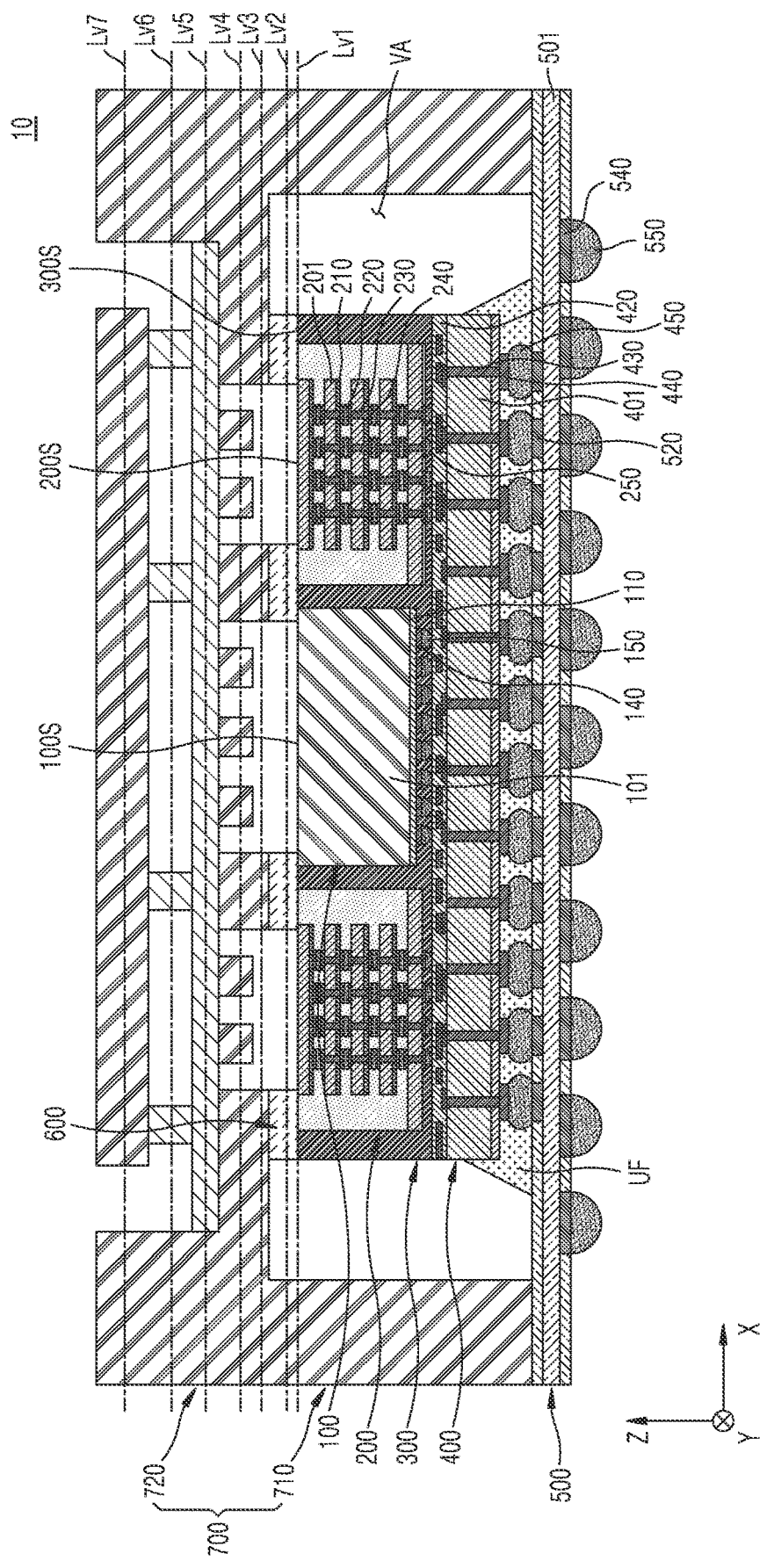
FIG. 1A is a cross-sectional view illustrating a semiconductor package according to embodiments of the inventive concept.
Figure 1B:
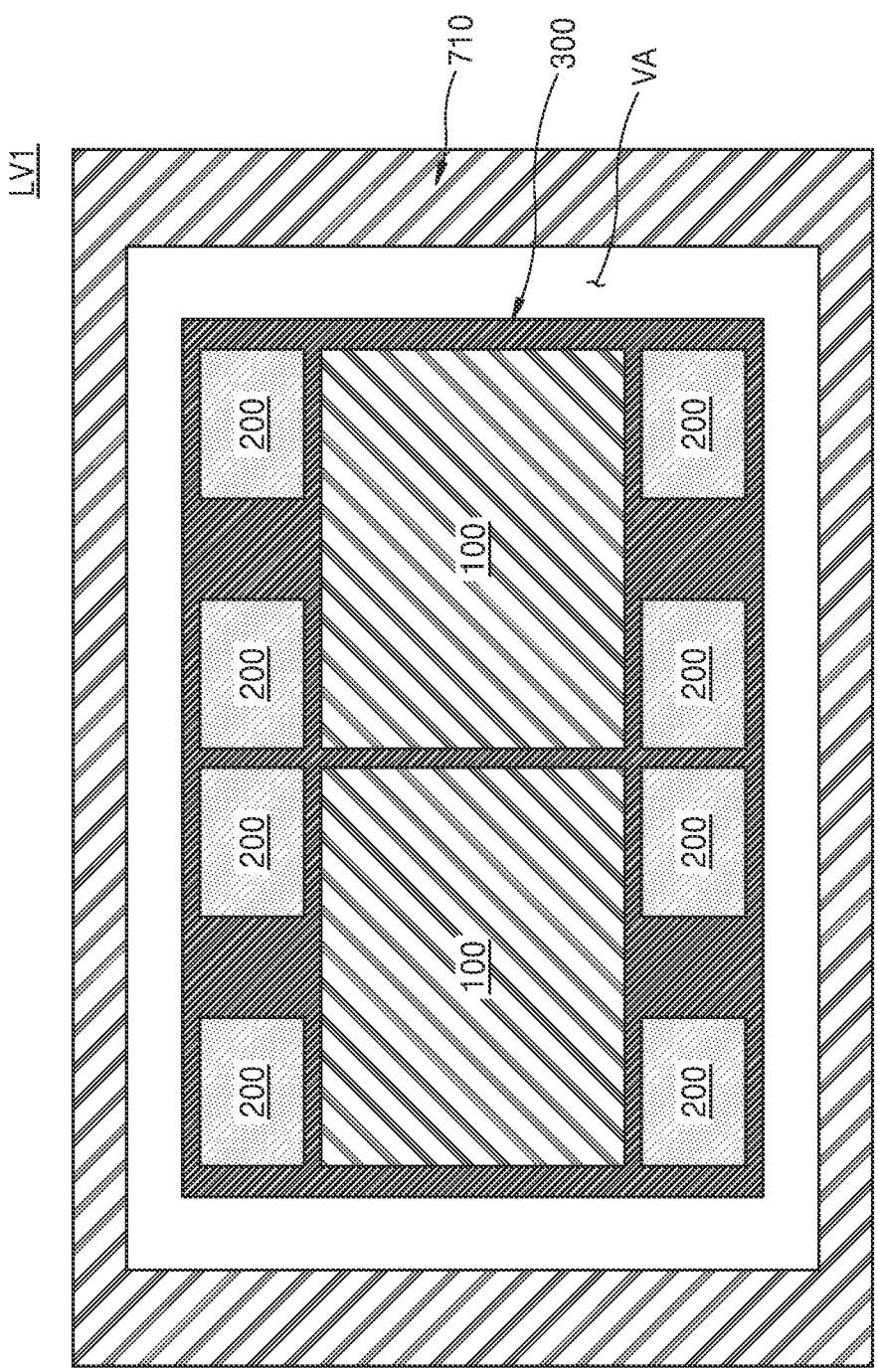
Figure 1C:
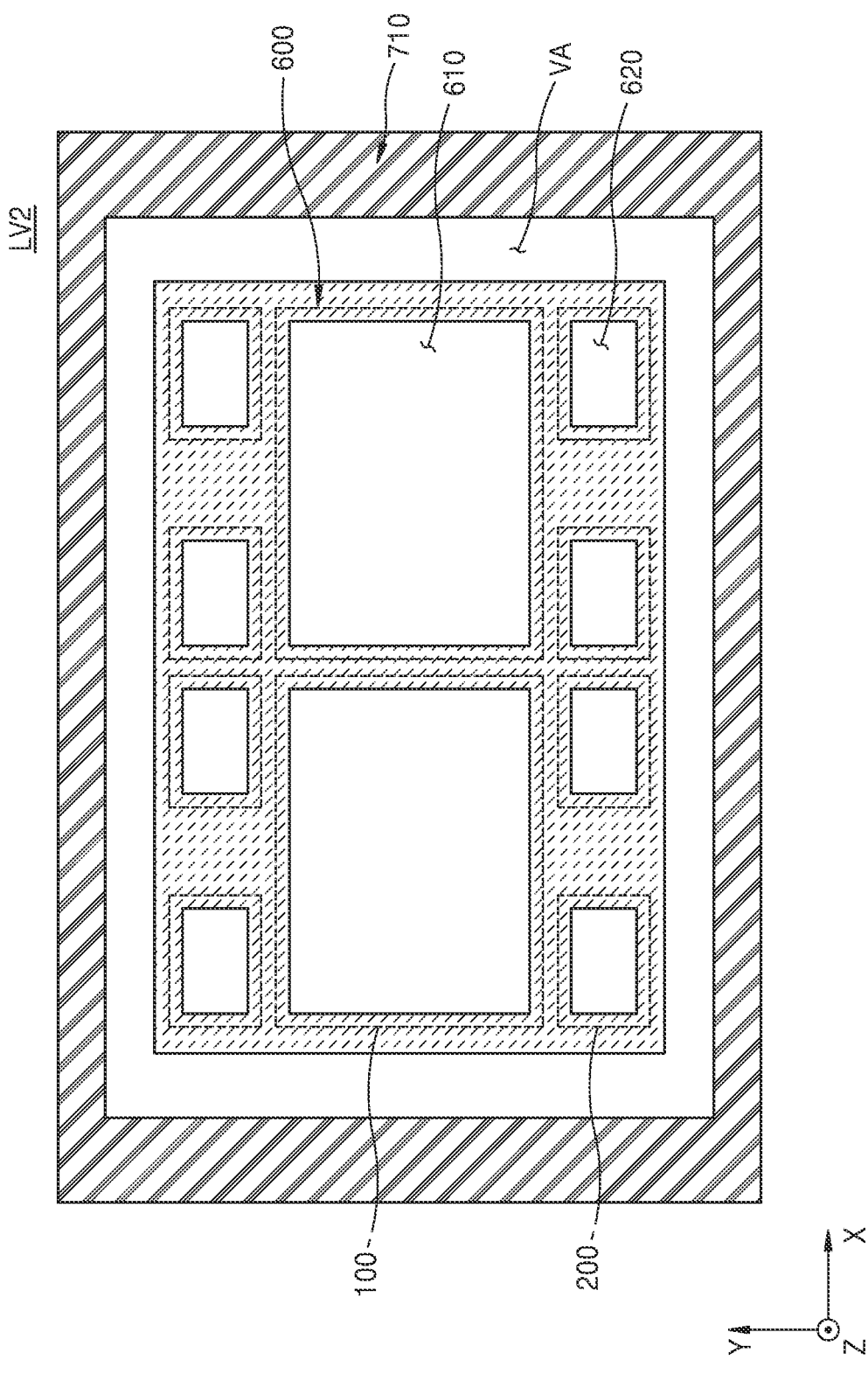
Figure 1D:
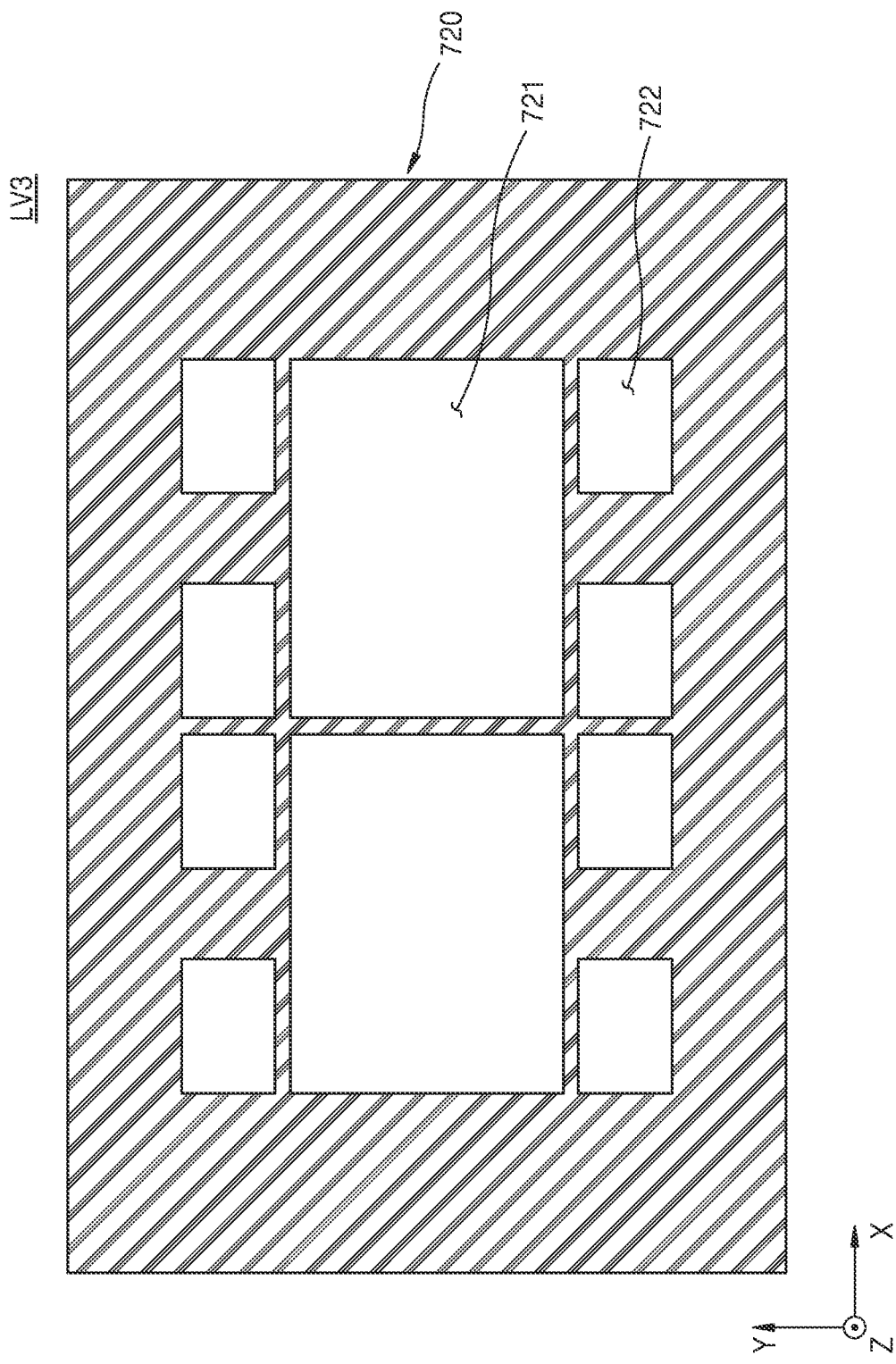
Figure 1F:
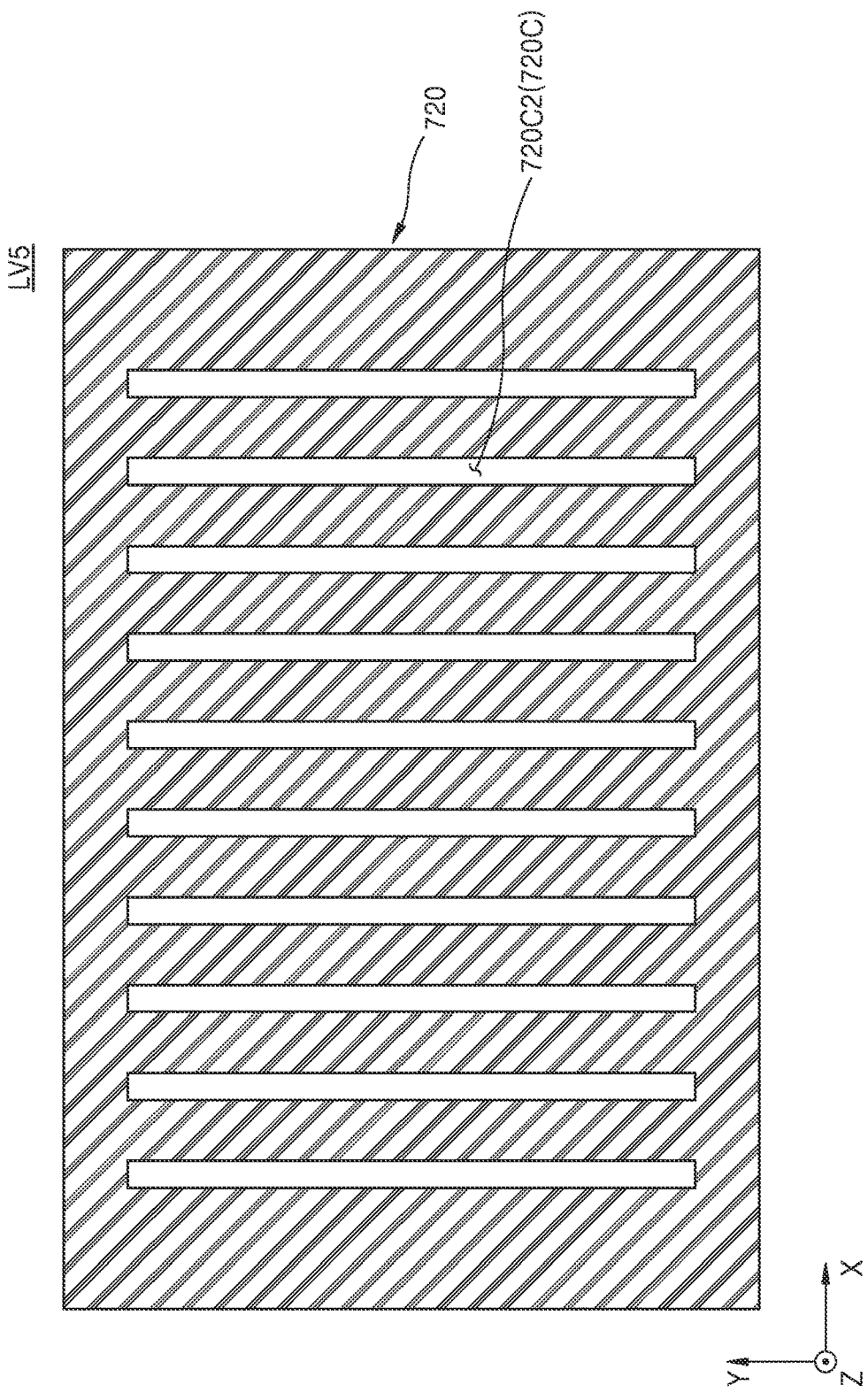

FIG. 1A is a cross-sectional view illustrating a semiconductor package 10 according to embodiments of the inventive concept, and FIGS. 1B to 1H are respective plan views illustrating different levels (e.g., LV1, LV2, LV3, LV4, LV5, LV6, and LV7) of the semiconductor package 10 of FIG. 1A.

Referring to FIG. 1A, and FIGS. 1B to 1H, the semiconductor package 10 may include one or more first semiconductor chip(s) 100, one or more second semiconductor chip(s) 200, a molding member 300, an interposer 400, a package substrate 500, a sealing member 600, and a heat dissipation member 700.

The first semiconductor chip(s) 100 and the second semiconductor chip(s) 200 may perform different functions, and may be variously arranged on the package substrate 500. For example, the first semiconductor chip(s) 100 and second semiconductor chip(s) 200 may be arranged side by side in a first horizontal (or X-) direction and/or a second horizontal (or Y-) direction. As shown for example in FIG. 1B, a number (e.g., four) of second semiconductor chips 200 may laterally arranged (e.g., in at least one of the first horizontal direction and the second horizontal direction) around a first semiconductor chip 100.

In this regard, the first semiconductor chip 100 may be a logic chip (e.g., a semiconductor chip including one or more logic circuits and/or signal processing circuits). Here, the logic circuits may include, for example; inverter, flip-flop, AND, OR, NAND, NOR, XOR and NXOR elements. The signal processing circuits may include, for example; analog signal processing circuits, analog-to-digital (A/D) conversion circuits, digital signal processing circuits, registers, latches, control circuits, etc.

In some embodiments, the first semiconductor chip 100 may be implemented as a microprocessor, a graphic processor, a signal processor, a network processor, a chipset, an audio codec, a video codec, an application processor, a system on chip (SoC), etc.

The second semiconductor chip(s) 200 may include volatile memory chip(s) and/or non-volatile memory chip(s). The volatile memory chip may be, for example, a dynamic random access memory (RAM) (DRAM), a static RAM (SRAM), or a thyristor RAM (TRAM). The non-volatile memory chip may be, for example, a flash memory, a magnetic RAM (MRAM), a spin-transfer torque MRAM (STT-MRAM), a ferroelectric RAM (FRAM), a phase change RAM (PRAM), or a resistive RAM (RRAM).

In some embodiments, each of the second semiconductor chip(s) 200 may be a memory chiplet including a plurality of memory chips capable of merging data. In some embodiments, each of the second semiconductor chip(s) 200 may be a high bandwidth memory (HBM) chip.

Referring to FIG. 1A, the first semiconductor chip 100 may include a first semiconductor substrate 101, a first semiconductor wiring layer 110, a first connection pad 140, and a first connection member 150.

The first semiconductor chip 100 may include a single slice, and the single slice may be configured as the first semiconductor substrate 101. The first semiconductor substrate 101 (e.g., a wafer) may include an active surface and an opposing inactive surface. Here, the inactive surface of the first semiconductor substrate 101 may be an upper surface 100S of the first semiconductor chip 100 exposed through the molding member 300.

In some embodiments, the first semiconductor substrate 101 may include silicon (Si) (e.g., crystalline silicon, polycrystalline silicon, and/or amorphous silicon). Alternately or additionally, the first semiconductor substrate 101 may include germanium (Ge), silicon carbide (SiC), gallium arsenide (GaAs), indium arsenide (InAs), and/or indium phosphide (InP).

In some embodiments, the first semiconductor substrate 101 may be a silicon on insulator (SOI) structure, and may include a buried oxide (BOX) layer. In some embodiments, the first semiconductor substrate 101 may include a conductive region (e.g., a well region or structure selectively doped with one or more impurities). Also, the first semiconductor substrate 101 may further include various isolation structures, such as a shallow trench isolation (STI) structure.

The first semiconductor wiring layer 110 may be disposed on the active surface of the first semiconductor substrate 101, and may be electrically connected to the first connection pad 140 on the first semiconductor wiring layer 110. The first semiconductor wiring layer 110 may be electrically connected to the first connection member 150 through the first connection pad 140. The first connection pad 140 may include at least one of, for example, aluminum (Al), copper (Cu), nickel (Ni), tungsten (W), platinum (Pt), and gold (Au).

The first connection member 150 may be disposed to electrically connect the first semiconductor chip 100 and the interposer 400. The first connection member 150 may be a solder ball attached to the first connection pad 140. The solder ball may include at least one of, for example, Au, Ag, Cu, Al, and tin (Sn). In some embodiments, the solder ball may be connected to the first connection pad 140 using any one of, for example, a thermo compression connection method, an ultra sonic connection method, and a thermo sonic connection method.

One or more control signal(s), power signal(s), and/or ground signal(s) associated with the operation of the first semiconductor chip 100 may be externally provided through the first connection member 150. Read data (e.g., data retrieved from memory) may be temporarily stored in the first semiconductor chip 100 before being provided to an external circuit, and write data (e.g., data to-be-written to memory) may be temporarily stored in the first semiconductor chip 100 as received from an external circuit.

Each of the second semiconductor chip(s) 200 may include a second semiconductor substrate 201, a second semiconductor wiring layer 210, second upper connection pads 220, second through electrodes 230, and second lower connection pads 240, and a second connection member 250.

Each of the second semiconductor chip(s) 200 may include multiple slices, wherein each of the slices may be configured as a second semiconductor substrate 201. Each of the second semiconductor substrates 201 may configured as a vertically stacked (e.g., stacked in a vertical (or Z−) direction) set of chips. Each of the second semiconductor substrates 201 may be substantially the same. That is, each of the second semiconductor chip(s) 200 may have a stacked structure, such that each of the slices operates as a memory chip capable of merging data.

Each of the second semiconductor substrates 201 may include an active surface and an opposing inactive surface. Here, the inactive surface of an uppermost layer among the second semiconductor substrates 201 may be an upper surface 200S of a second semiconductor chip 200 exposed through the molding member 300. The remainder of the second semiconductor substrates 201, excepting the uppermost layer, may include a second through electrodes 230 penetrating the remainder of the second semiconductor substrates 201. Here, each of the second through electrodes 230 may be a through silicon via (TSV), for example.

The second upper connection pads 220 and the second lower connection pads 240 may be respectively and electrically connected to upper and lower ends of the second through electrodes 230. Also, the second lower connection pads 240 may be electrically connected to the second semiconductor wiring layer 210 on the active surface of the second semiconductor substrate 201. The second semiconductor wiring layer 210 may be electrically connected to the second connection member 250 through the second lower connection pad 240.

The second connection member 250 may contact a lowermost layer of the second semiconductor substrates 201 to electrically connect the second semiconductor chip 200 and the interposer 400. In some embodiments, the second connection member 250 may be a solder ball respectively attached to a second lower connection pad 240.

One of more control signal(s), command signal(s), power signal(s), ground signal(s), and/or address signal(s) associated with the operation of the second semiconductor chip(s) 200 may be variously received from an external source through the second connection member 250. One or more write data signal(s) to be stored in the second semiconductor chip(s) 200 may be received from an eternal circuit, and/or one or more read data signals retrieved from the second semiconductor chip(s) 200 may be provided to an external circuit.

The molding member 300 may substantially surround the first semiconductor chip 100 and the second semiconductor chip(s) 200. That is, the molding member 300 may substantially surround side surfaces and a lower surface of each of the first semiconductor chip 100 and the second semiconductor chip(s) 200. Here, the molding member 300 may expose the upper surfaces 100S and 200S of the first semiconductor chip 100 and the second semiconductor chip(s) 200. Accordingly, the upper surface 300S of the molding member 300 and the upper surfaces 100S and 200S of the first semiconductor chip 100 and the second semiconductor chip(s) 200 may be substantially coplanar at the first level LV1.

The molding member 300 may serve to protect the first and second semiconductor chips 100 and 200 from vibration, mechanical shock and/or contamination. To perform such functions, the molding member 300 may be formed of an epoxy mold compound and/or resin. In addition, the molding member 300 may be formed, for example, by compression molding, lamination, and/or screen printing.

The first semiconductor chip 100 and the second semiconductor chip(s) 200 may be disposed on the interposer 400, wherein the interposer 400 may variously interconnect the first semiconductor chip 100 and the second semiconductor chip(s) 200. In some embodiments, the interposer 400 may include a Si substrate 401 and a redistribution structure 420 disposed on the Si substrate 401. In addition, the interposer 400 may further include; through electrodes 430 electrically connected to the redistribution structure 420 and penetrating the Si substrate 401, connection pads 440 disposed on a lower portion of the Si substrate 401 and electrically connected to the through electrodes 430, and an internal connection terminal 450 variously connected to the connection pads 440.

The interposer 400 may be disposed on the package substrate 500. Here, the package substrate 500 may include a printed circuit board (PCB), a wafer substrate, a ceramic substrate, a glass substrate, etc. In the semiconductor package 10 of FIG. 1A, the package substrate 500 is assumed to be a PCB. The package substrate 500 may include bump pads 540 disposed on a lower surface of a body portion 501 and external connection terminals 550 respectively attached to the bump pads 540. Thus, the semiconductor package 10 may be mounted by electrically connecting a main board 1010 (see, e.g., FIG. 10) or a system board of an electronic device 1000 (see, e.g., FIG. 10) through the external connection terminal 550.

An underfill UF may be formed between the interposer 400 and the package substrate 500, and may substantially surround the internal connection terminals 450. The underfill UF may include, for example, an epoxy resin. In some embodiments, a non-conductive film NCF may additionally be formed.

The sealing member 600 may be disposed on upper portions of the first semiconductor chip 100 and the second semiconductor chip(s) 200 and the molding member 300 surrounding the first semiconductor chip 100 and the second semiconductor chip(s) 200 to expose the upper surfaces 100S and 200S of the first semiconductor chip 100 and the second semiconductor chip(s) 200.

The sealing member 600 extends along (e.g., to seal) an interface between the first semiconductor chip 100 and the second semiconductor chip(s) 200 and the molding member 300 surrounding the first semiconductor chip 100 and the second semiconductor chip(s) 200 to prevent moisture or humidity from infiltrating into the interface. Accordingly, the sealing member 600 may include a material having excellent waterproofing properties. For example, the sealing member 600 may be configured by adding epoxy or silicone to a polymer material such as polyurethane, polytetrafluoroethylene, etc. In addition, a thickness of the sealing member 600 may range from about 1 μm to about 300 μm for some embodiments.

The sealing member 600 may cover edge regions of the molding member 300 and the upper surfaces 100S and 200S of the first semiconductor chip 100 and the second semiconductor chip(s) 200, and a central region of the upper surfaces 100S and 200S may be exposed by first and second opening regions 610 and 620 at the second level LV2. In some embodiments, sidewalls of the sealing member 600 may be disposed to coincide with sidewalls of the molding member 300.

In some embodiments, the sealing member 600 may be adhesive in nature, such that the sealing member 600 may be fixed to the first semiconductor chip 100, the second semiconductor chip(s) 200 and the molding member 300. Accordingly, a tight seal for the sealing member 600 may be further ensured.

The heat dissipation member 700 may include a lower structure 710 and an upper structure 720 in terms of location. The lower structure 710 may extend from the package substrate 500 to the upper structure 720 in the vertical direction, support the upper structure 720 and constitute one body with the upper structure 720. The upper structure 720 may be disposed at a certain position on the upper portions of the first and second semiconductor chips 100 and 200 by the lower structure 710. In the heat dissipation member 700, the lower structure 710 may support the upper structure 720, be spaced apart from the interposer 400 and the first and second semiconductor chips 100 and 200 in order to form a void (or empty space) VA disposed on the package substrate 500 between an inner sidewall of the lower structure 710 and an outer sidewall of a combination of the sealing member 600, the molding member 300, the interposer 400, and the underfill UF.

In some embodiments, the heat dissipation member 700 may include a material having high mechanical strength and high thermal conductivity. As such, the heat dissipation member 700 including the thermally conductive material may function well in dissipating heat generated by operation of the first semiconductor chip 100 and/or the second semiconductor chip(s) 200.

In some embodiments, the lower structure 710 and the upper structure 720 of the heat dissipation member 700 may include the same material (e.g., a metal material having high corrosion resistance), and may have a rectangular cylindrical shape. For example, the heat dissipation member 700 may include at least one of, for example Cu, Al, and stainless steel (SUS), but is not limited thereto. In some embodiments, a thickness of the upper structure 720 of the heat dissipation member 700 may range from about 1 μm to about 2000 μm, but is not limited thereto.

Those skilled in the art will appreciate form the foregoing that the heat dissipation member 700 may be variously configured in accordance with the functional nature and overall physical dimensions and structure of the semiconductor package 10. For example, in some embodiments, the heat dissipation member 700 may further include an air-cooled or a water-cooled cooling system.

Thus, the upper structure 720 of the heat dissipation member 700 may have a structure that facilitates the outward dissipation (or the outward exhausting) of thermal energy generated by the first semiconductor chip 100 and/or the second semiconductor chip(s) 200 at a third level LV3 of the semiconductor package 10. For example, the upper structure 720 may have a flat plate shape covering upper surfaces of the first semiconductor chip 100, the second semiconductor chip(s) 200, and the molding member 300. However, central region(s) of the upper surfaces 100S and 200S of the first semiconductor chip 100 and the second semiconductor chip(s) 200 may remain exposed by first and second cooling regions 721 and 722. (See, e.g., FIG. 1D). Accordingly, the upper structure 720 may contact the upper surface of the sealing member 600. Here, in some embodiments, the first and second cooling regions 721 and 722 may have the same shape and/or size as that of the first and second opening regions 610 and 620 of the sealing member 600. (See, e.g., FIG. 1C)

Microchannel(s) 720C may be disposed (e.g., in a multilayer arrangement) in the upper structure 720 of the heat dissipation member 700. (See, e.g., FIG. 1E). For example, the microchannel(s) 720C may include lowermost microchannel(s) 720C1 extending in the first horizontal direction and spaced apart in the second horizontal direction at the fourth level LV4 of the semiconductor package 10, and uppermost microchannel(s) 720C2 extending in the second horizontal direction and spaced apart from each other in the first horizontal direction at the fifth level LV5. (See, e.g., FIGS. 1E and 1F).

The heat dissipation member 700 may further include micropillar(s) 720P serving as support structure(s) in the upper structure 720 at sixth level LV6 of the semiconductor package 10. The micropillar(s) 720P may be arranged side by side in at least one of the first horizontal direction and the second horizontal direction. In this regard, the combination of the microchannel(s) 720C and the micropillar(s) 720P may be configured to induce a vortex generation of coolant. (See, e.g., element CT of FIG. 6, described in some additional detail hereafter).

Figure 1H:
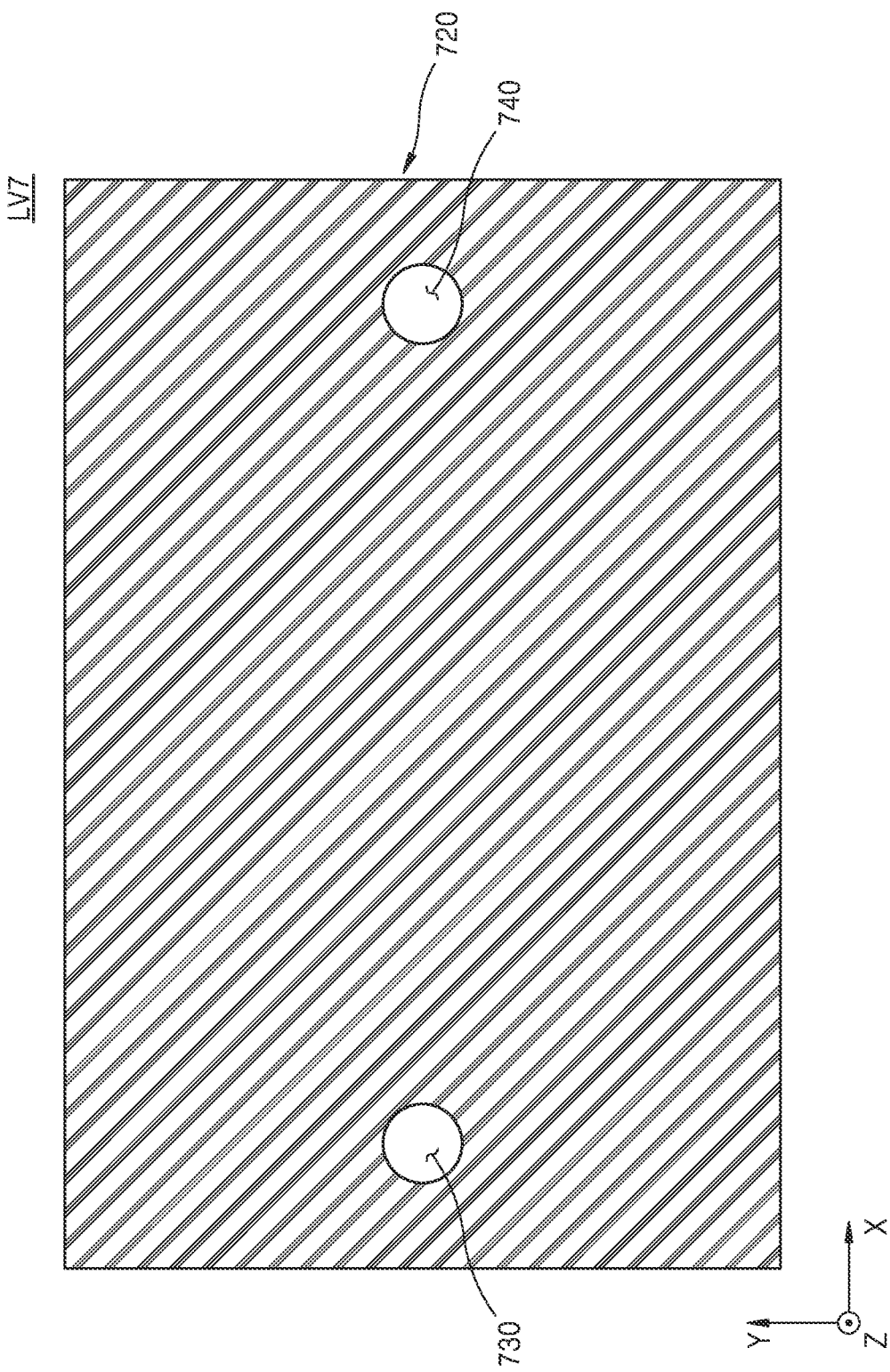

Referring to FIG. 1H, a fluid (or coolant) inlet port 730 and a fluid (or coolant) outlet port 740 may be respectively disposed in the upper surface of the upper structure 720 of the heat dissipation member 700 at the seventh level LV7 of the semiconductor package 10. Although a single fluid inlet port 730 and a single fluid outlet port 740 are shown in FIG. 1H, multiple fluid inlet ports 730 and/or multiple fluid outlet ports 740 may be used. The fluid inlet port 730 and the fluid outlet port 740 may be disposed external to the sealing member 600.

In the upper structure 720 of the heat dissipation member 700, the first and second cooling regions 721 and 722, the lower microchannel(s) 720C1, the upper microchannel(s) 720C2, the fluid inlet port(s) 730, and the fluid outlet port(s) 740 may be variously interconnected to form a cooling space extending (e.g.,) through the third level LV3, the fourth level LV4, the fifth level LV5, the sixth level LV6, and/or the seventh level LV7 of the semiconductor package 10. (See collectively, e.g., FIGS. 1C, 1D, 1F, 1G and 1H). In this manner, the cooling space may be used to exhaust thermal energy from at least the upper surfaces 100S and 200S of the first semiconductor chip 100 and the second semiconductor chip(s) 200.

Thus, semiconductor packages with a cooling system consistent with embodiments of the inventive concept exhibit a fast thermal response time and excellent thermal transfer capacity, such that overheating and thermal fatigue problems conventionally associated with comparative semiconductor packages do not arise in a serious manner, thereby allowing multiple semiconductor chips to be arranged and operated within a single semiconductor package of limited size.

For example, semiconductor packages with a cooling system according to embodiments of the inventive concept may thermally connect a water-cooled system with upper portion(s) of a heat dissipation member while also providing a sealing member that tightly seals an interface (or materials boundary) between semiconductor chips and a surrounding molding member. In this manner, direct cooling of the upper surfaces of the semiconductor chips using a liquid coolant agent (e.g., ultrapure water) may be accomplished in a structure possessing excellent liquid-proofing safeguards.

Accordingly, effective heat dissipation members consistent with embodiments of the inventive concept may improve overall reliability of semiconductor packages by preventing performance deterioration or malfunction of constituent semiconductor chips due to overheating. In addition, heat dissipation members consistent with embodiments of the inventive concept may improve overall reliability of electronic devices incorporating such semiconductor package(s) by preventing thermal fatigue of components caused by thermal energy during the operation of the constituent semiconductor device(s).

Ultimately, semiconductor packages according to embodiments of the inventive concept allow efficiently arrangement of multiple semiconductor chips within a semiconductor package of limited area through the inclusion of a sealing member and a heat dissipating member facilitating the use of a liquid coolant, such as ultrapure water. In this manner, potentially damaging thermal energy may be efficiently and safely exhausted from semiconductor package(s) during operation of electronic devices including such semiconductor package(s).

FIGS. 2, 3, 4 and 5 are respective cross-sectional views illustrating semiconductor packages 20, 30, 40, and 50 according to embodiments of the inventive concept. Here, the embodiments of FIGS. 2, 3, 4, and 5 will be described primarily in relation to material differences (e.g., omitted, additional and/or varied elements) with the embodiment of FIG. 1A.

Figure 2:
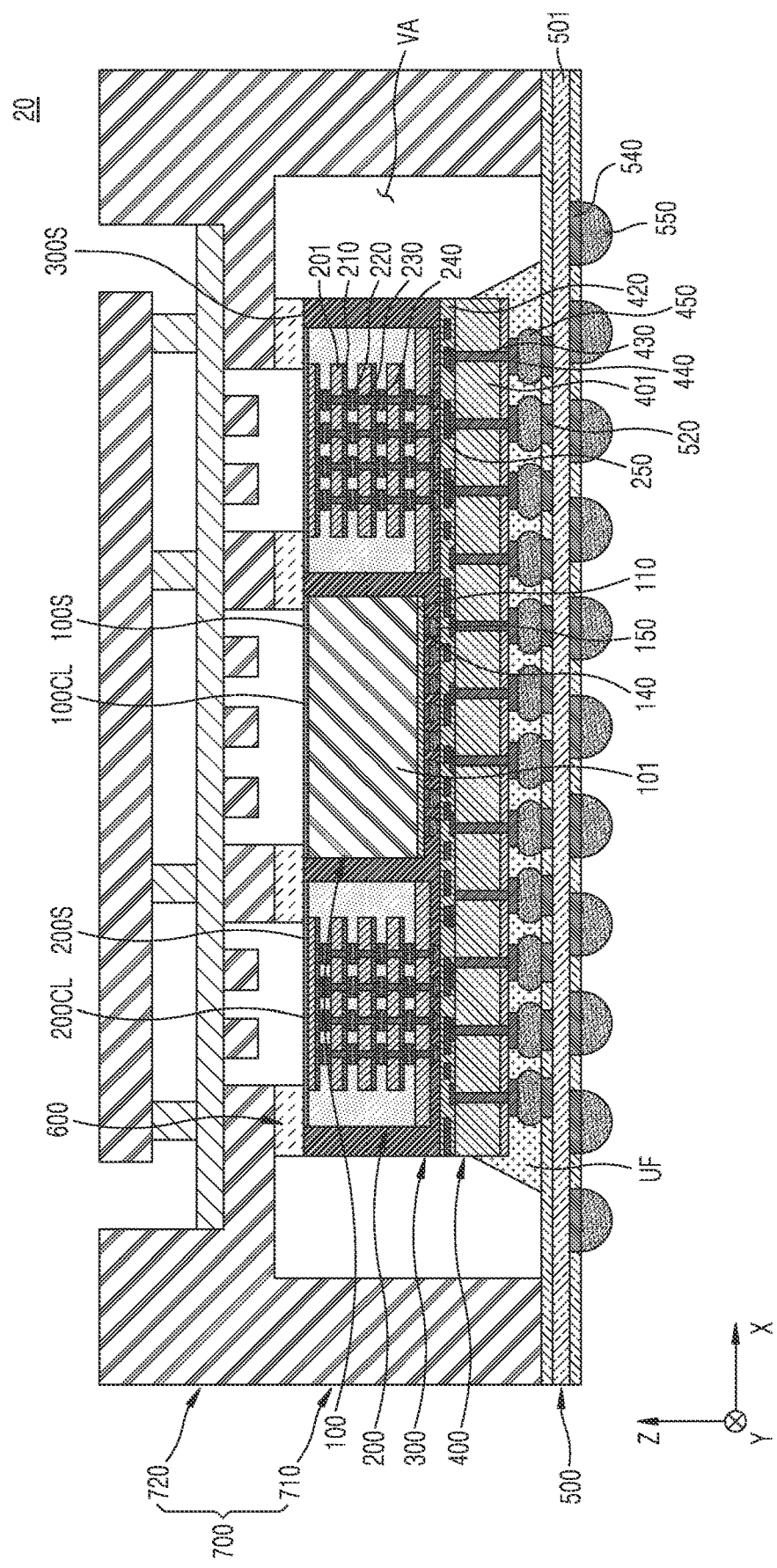
FIGS. 2, 3, 4, and 5 are respective cross-sectional views illustrating various semiconductor packages according to embodiments of the inventive concept.

Referring to FIG. 2, the semiconductor package 20 may additionally include a first coating layer 100CL formed on the upper surface 100S of the first semiconductor chip 100, and a second coating layer 200CL formed on the upper surface 200S of the second semiconductor chip(s) 200.

In this regard, the first and second coating layers 100CL and 200CL serve to further dissipate thermal energy (or heat) generated by operation of the first semiconductor chip 100 and/or the second semiconductor chip(s) 200. In some embodiments, efficient heat dissipation characteristics may be achieved by collectively forming both of the first and second coating layers 100CL and 200CL on the upper surfaces 100S and 200S of the first semiconductor chip 100 and/or the second semiconductor chip(s) 200. Alternately, the first and second coating layers 100CL and 200CL may be respectively formed on an upper surface of the first semiconductor substrate 101 and an upper surface of the uppermost layer of the second semiconductor substrate 201.

In some embodiments, the first and second coating layers 100CL and 200CL may include at least one of, for example, a thin film, a film, and/or a metal (e.g., Al, Cu, or W) tape.

In some embodiments, the first and second coating layers 100CL and 200CL may include at least one of, for example, epoxy, acrylic, and silicone in order to obtain excellent heat dissipation.

In some embodiments, the first and second coating layers 100CL and 200CL may include resin containing a thermally conductive filler (e.g., alumina ($Al_2O_3$), boron nitride (BN), aluminum nitride (AlN), and/or diamond). In this regard, the first and second coating layers 100CL and 200CL may include a curable material, such as a resin capable of thermal curing at about room temperature, or a resin capable of UV curing.

Figure 3:
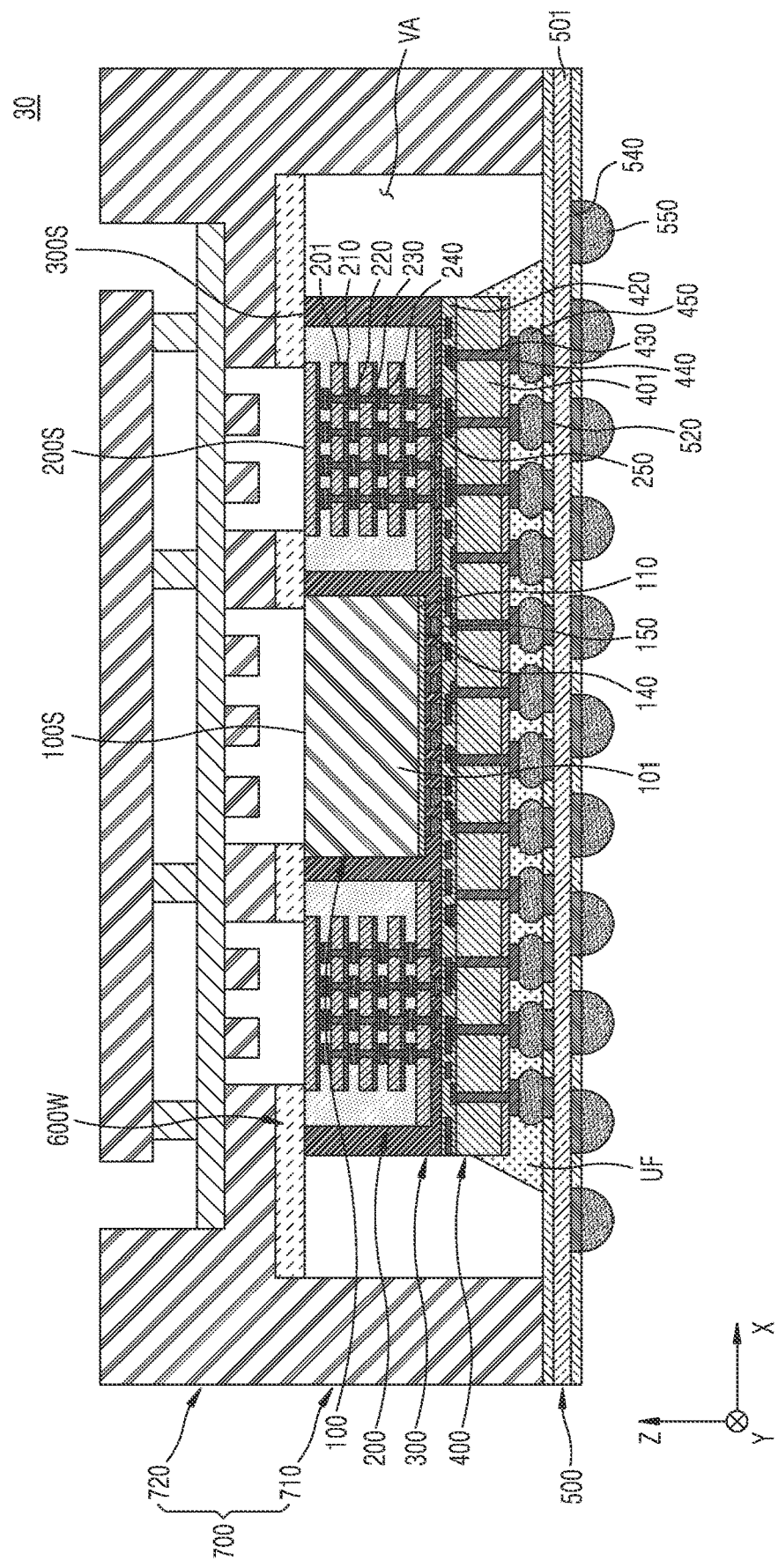

Referring to FIG. 3, the semiconductor package 30 may alternately include a relative wider sealing member 600W.

Like the sealing member 600 of FIG. 1A, the wider sealing member 600W of FIG. 3 may cover outer edge regions of the molding member 300 and at least some portion(s) of the upper surfaces 100S and 200S of the first semiconductor chip 100 and the second semiconductor chip(s) (e.g., leaving selected central region(s) of the upper surfaces 100S and 200S exposed). However, instead of extending only to the outer edge of the molding member 300, the wider sealing member 600W may extend outwardly beyond an outer sidewall of the molding member 300.

That is, an upper surface of the wider sealing member 600W may be formed in contact with lower surface of the upper structure 720 of the heat dissipation member 700, and an outer side surface of the wider sealing member 600W may be formed in contact with an inner sidewall of the lower structure 710 of the heat dissipation member 700.

Figure 4:
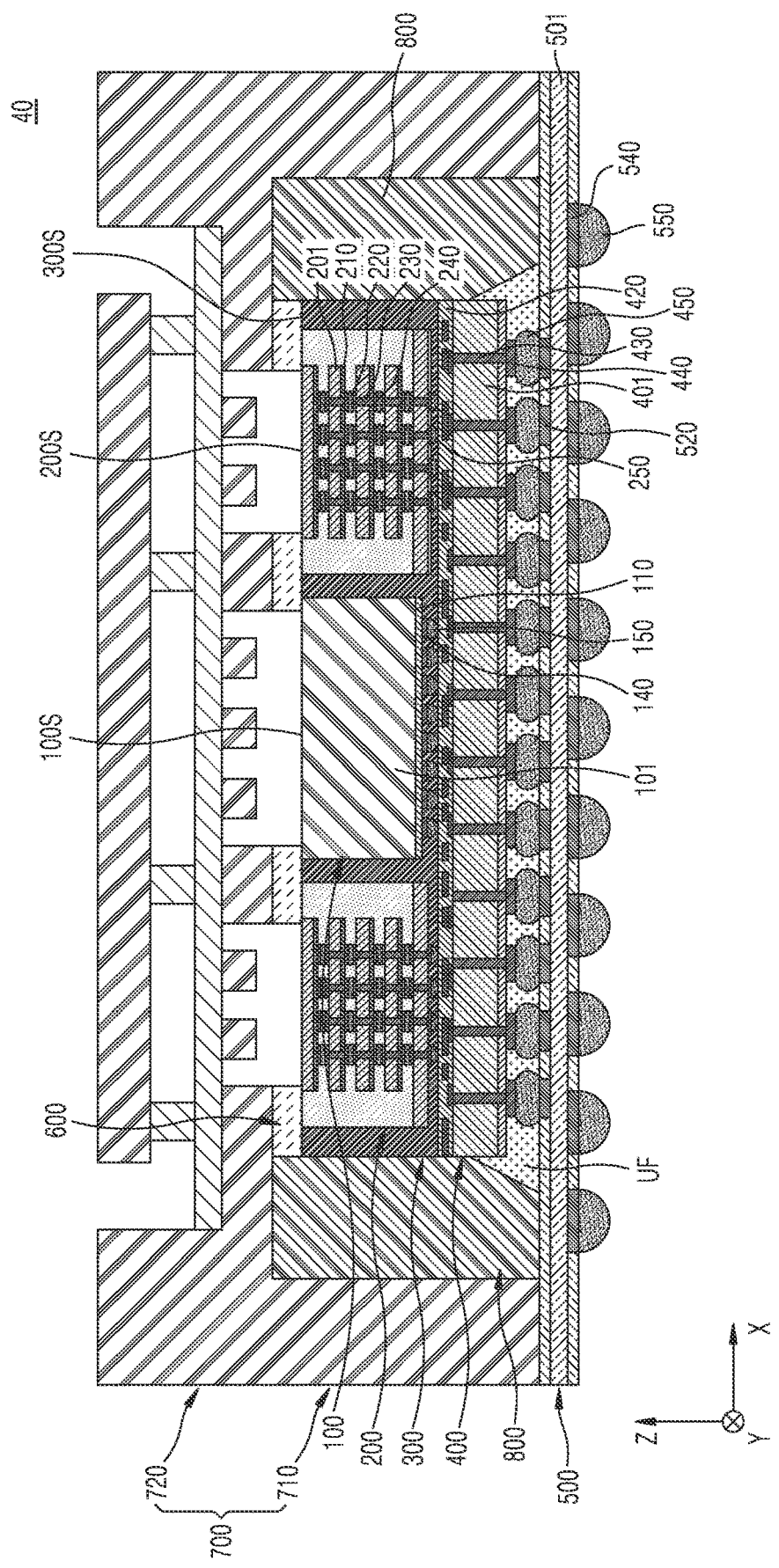

Referring to FIG. 4, the semiconductor package 40 may alternately include a first sealing member 600 together with a second sealing member 800. For example, the second sealing member 800 may be used to substantially infill the void VA indicated in FIG. 1A.

In this regard, the sealing member 800 may more securely adhere the package substrate 500 with the heat dissipation member 700 and/or further protect the first semiconductor chip 100 and/or second semiconductor chip(s) 200 from vibrations, mechanical shock, and/or contamination.

In some embodiments, the second sealing member 800 may include at least one of, for example, an epoxy mold compound and resin. That is, the sealing member 800 may include substantially the same material(s) as the molding member 300, but is not limited thereto.

Figure 5:
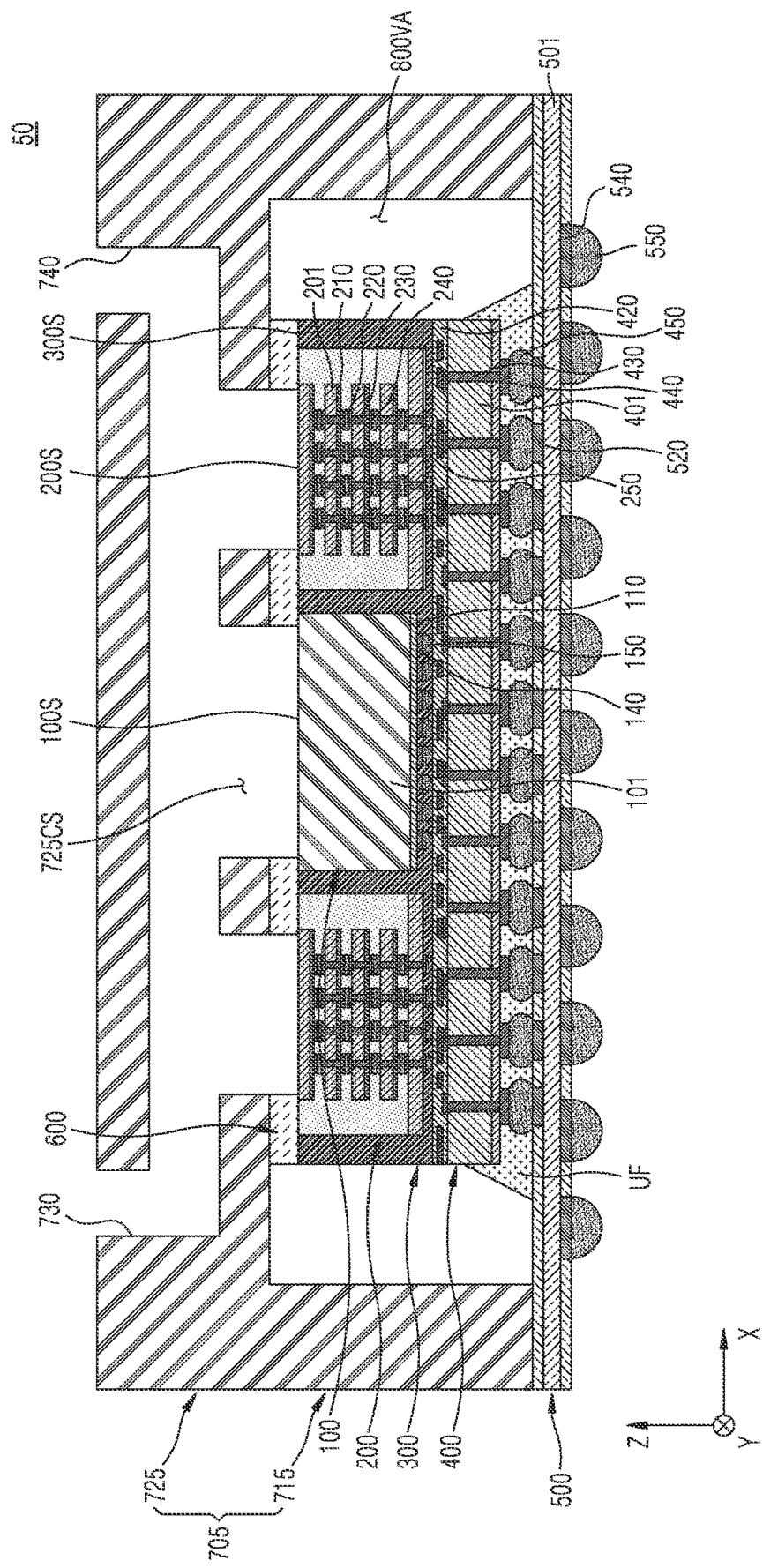

Referring to FIG. 5, the semiconductor package 50 may alternately include a heat dissipation member 705.

Here, the heat dissipation member 705 may include a lower structure 715 and an upper structure 725, wherein the lower structure 715 vertically extends from the package substrate 500 to the upper structure 725 in order to support the upper structure 725 and/or constitute a unitary body with the upper structure 725.

The upper structure 725 of the heat dissipation member 705 may include a cooling space 725CS in which microchannel(s) and/or micropillar(s) may be formed. Thus, the cooling space 725CS may be thermally connected (e.g., contacting in such a manner to effect heat exchange) with the respective upper surfaces 100S and 200S of the first semiconductor chip 100 and/or the second semiconductor chip(s). The upper structure 725 of the heat dissipation member 705 may also be connected to allow fluid transfer between fluid inlet port(s) 730 and fluid outlet port(s) 740.

Figure 6:
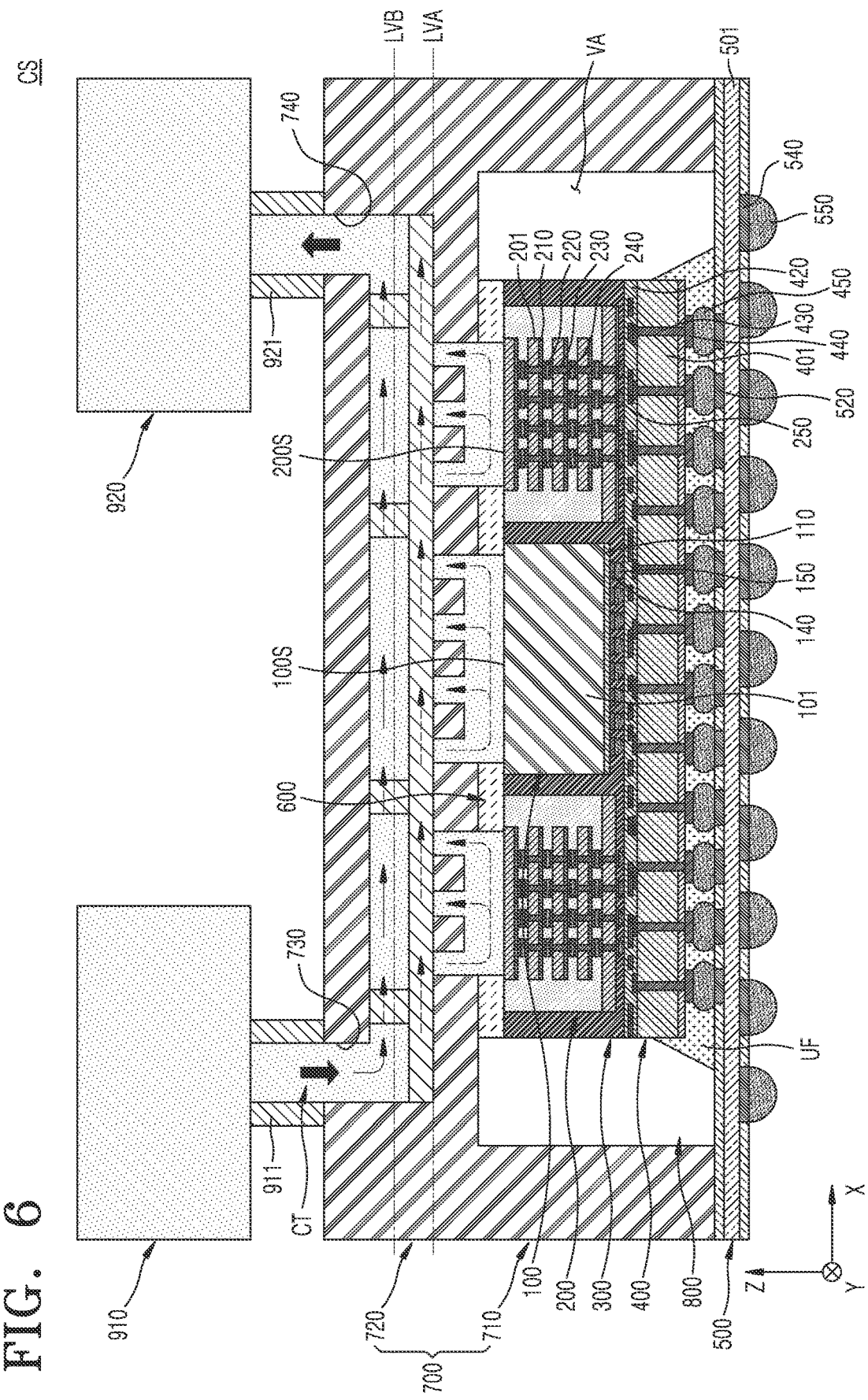
FIG. 6 is a cross-sectional view illustrating a semiconductor package and a cooling system according to embodiments of the inventive concept.

FIG. 6 is a cross-sectional view illustrating a combination of the semiconductor package 10 of FIG. 1A and a cooling system CS according to embodiments of the inventive concept.

Referring to FIG. 6, the cooling system CS may be externally disposed in relation to the semiconductor package 10. For example, the cooling system CS may be disposed an upper portion of the semiconductor package 10.

Assuming that the cooling system CS uses ultrapure water as a coolant CT, the cooling system CS may include a water cooling pump 910 and a heat dissipater 920 facilitating the transfer (or flow) of the coolant CT.

Here, it should be noted that one or more additives may be included with the ultrapure water in the coolant CT. Such additives may include, for example, surfactants, corrosion inhibitors, antifreeze, and nanoparticles contributing to thermal conductivity.

In some embodiments, the cooling system CS including the water cooling pump 910 and the heat dissipater 920 may be connected by a piping system respectively connected to the fluid inlet port(s) 730 and the fluid outlet port(s) 740 of the heat dissipating member 700. For example, a first interface pipe 911 may be connected to the fluid inlet port(s) 730, and a second interface pipe 921 may be connected to the fluid outlet port(s) 740.

As generally indicated by the arrow in FIG. 6, a transfer (or flow) path for the coolant CT may extend from the water cooling pump 910 to the heat dissipation member 700 through the piping system. Along this coolant transfer path, the coolant CT moves through the first and second cooling regions 721 and 722, as well as the upper microchannel(s) 720C2 and lower microchannel(s) 720C1 in the upper structure 720 of the heat dissipation member 700. As the result of this coolant CT flow, the coolant CT comes into thermal contact with the upper surfaces 100S and 200S of the first semiconductor chip 100 and the second semiconductor chip(s) 200, thereby directly cooling the first semiconductor chip 100 and the second semiconductor chip(s) 200. Ultimately, the coolant CT flows into the heat dissipater 920 (e.g., a heat spreader) from the fluid outlet port(s) 740 through the piping system, where the coolant CT may be cooled to a desired temperature.

With the foregoing configuration of the cooling system CS with the semiconductor package 10, operating speeds (e.g., applied clock speed)s)), operating duration(s) for various semiconductor chips within the semiconductor package 10, and/or power voltage(s) variously applied to the semiconductor package 10 may be increased without serious risk of damaging the semiconductor package 10 or an electronic device including same. That is, one or all of the foregoing operating variations (e.g., as selected examples)—each of which tends to increase the operating temperature of the semiconductor package 10—may be made because the cooling system CS is able to effectively exhaust the resulting increase in thermal energy otherwise accumulated in the semiconductor package 10.

In effect, the internal temperature of the semiconductor package 10 may be (designed and/or run) higher than that of conventional comparative semiconductor packages, due to the presence of the heat dissipation member 700 and the cooling system CS. That is, as the coolant CT flows across the upper surfaces 100S and 200S of the first semiconductor chip 100 and the second semiconductor chip(s) 200, a heat exchange occurs between the coolant CT and the first semiconductor chip 100 and the second semiconductor chip(s) 200, thereby reducing the overall thermal energy loading of the semiconductor package 10. The heated coolant resulting from this heat exchange may then be externally cooled using (e.g.) the heat spreader 920 until it reaches an acceptable temperature at which time the coolant may be recycled through the cooling system CS and semiconductor package 10.

In some embodiments, semiconductor packages according to embodiments of the inventive concept may be designed such that connection of the cooling system CS with the heat dissipation member 700 may be readily made at accessible upper portions of the heat dissipation member 700.

Further, the sealing member 600 may be formed on (or extend along) an interface between the first semiconductor chip 100 and the second semiconductor chip(s) 200 and the molding member 300, thereby securing excellent waterproofing (or liquid coolant-proofing) characteristics.

In some embodiments of the inventive concept, the coolant system CS may be a water-cooling system using ultrapure water, thereby providing excellent cooling performance at good economic value.

Figure 7A:
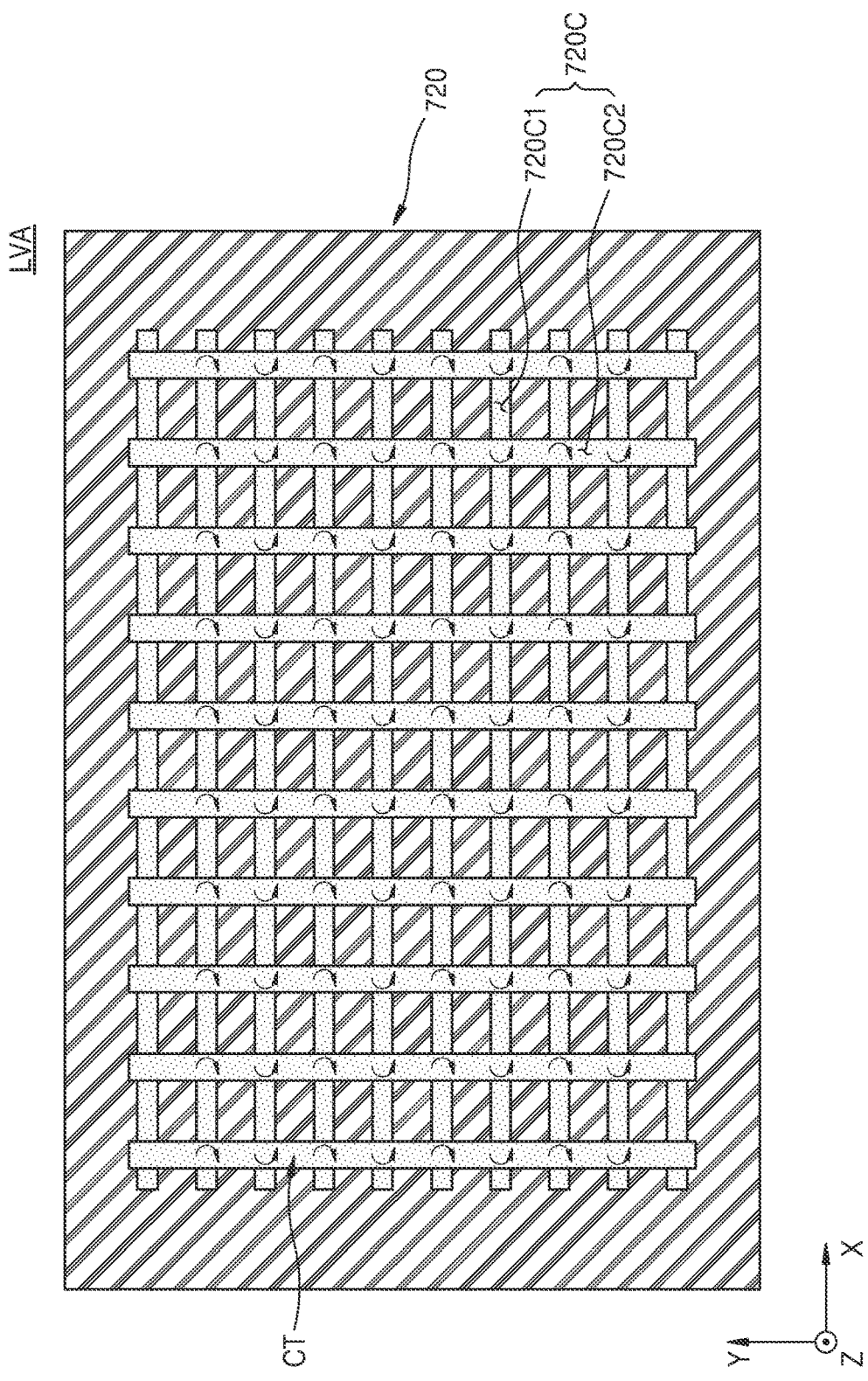
FIGS. 7A and 7B are respective plan views illustrating different levels of the semiconductor package of FIG. 6.
Figure 7B:
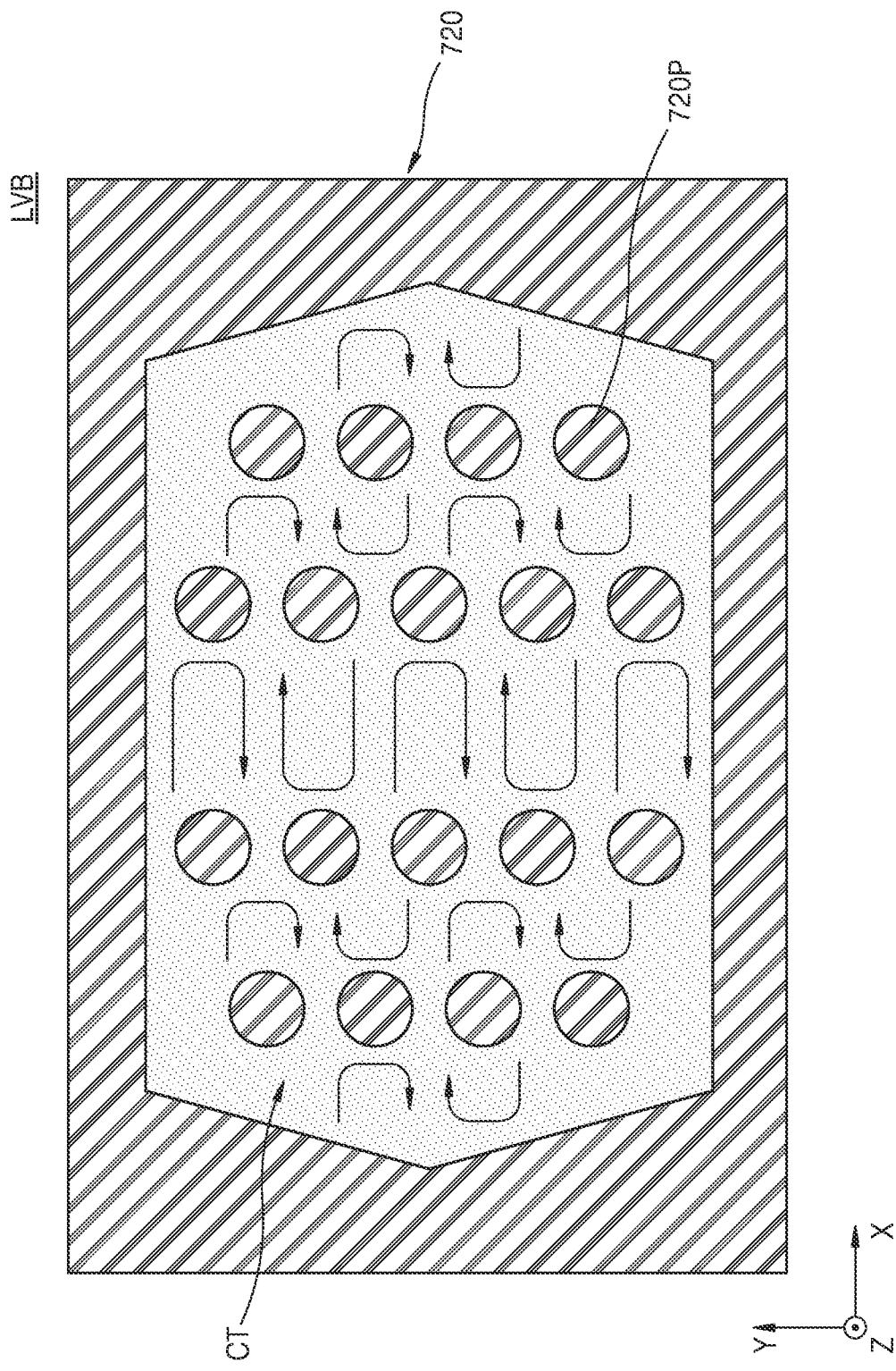

FIGS. 7A and 7B are respective plan views illustrating alternate levels LVA and LVB that may be incorporated in the semiconductor device of FIG. 6.

Referring to FIGS. 7A and 7B, vortex generation may be induced in the flow of coolant CT as the result of microchannel(s) 720C including a vertically overlapping pattern of lower microchannel(s) 720C1 and upper microchannel(s) 720C2, as well as micropillar(s) 720P.

In level LVA, vortex generation for the coolant CT may primarily occur at point(s) at which lower microchannel(s) 720C1 and upper microchannel(s) 720C2 intersect. Further, in level LVB, vortex generation primarily occurs in space(s) between laterally adjacent micropillars 720P. Hence, the size and layout of the microchannel(s) 720C, as well as the size and layout of the micropillar(s) 720P may be adjusted to maximize the agitation of the coolant CT throughput the transfer of coolant CT through the cooling system CS.

Such agitation (e.g., vortex motion as one example) of the coolant CT enhances heat exchange between the upper surfaces 100S and 200S of the first semiconductor device 100 and the second semiconductor chip(s) 200, thereby improving the efficiency of the cooling system CS in relation to the semiconductor package 10. In some embodiments, the upper structure 720 of the heat dissipation member 700 may include circulation space(s) through which the coolant CT may flow, thereby further enhancing agitation of the coolant CT.

Figure 8:
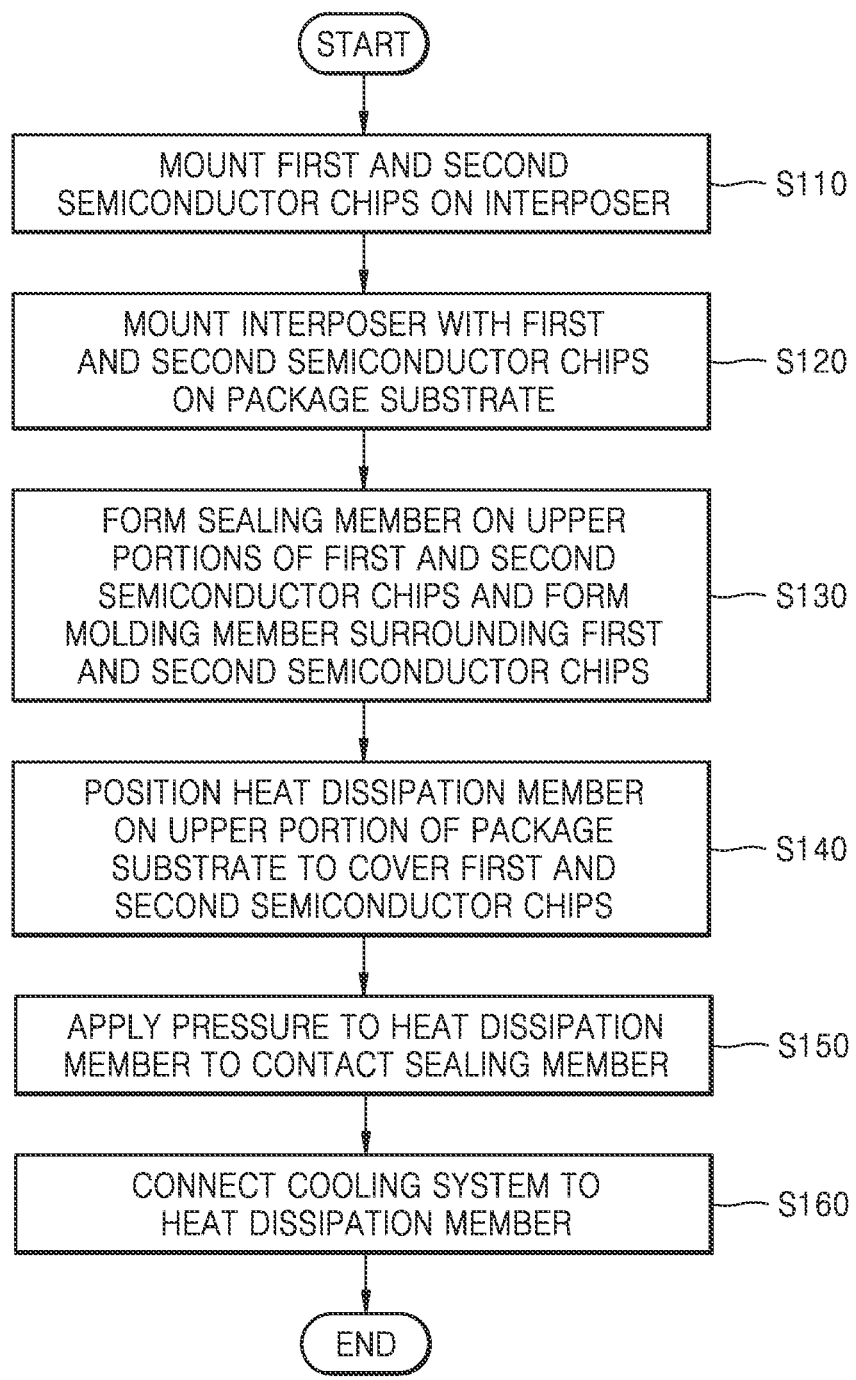
FIG. 8 is a flowchart illustrating in one example a method of manufacture for a semiconductor package and a cooling system according to embodiments of the inventive concept.

FIG. 8 is a flowchart illustrating in one example a method of manufacture for a semiconductor package and cooling system according to embodiments of the inventive concept.

Referring to FIG. 8, first and second semiconductor chips may be mounted on an interposer (S110). The interposer including the first and second semiconductor chips may then be mounted on a package substrate (S120). A sealing member may be formed on upper portions of first and second semiconductor chips, and a molding member may be formed surrounding the first and second semiconductor chips (S130). A heat dissipation member may be disposed (or positioned) on an upper portion of the package substrate to cover the first and second semiconductor chips (S140). Then, pressure may be applied to the heat dissipation member in contact with the sealing member (S150). Then, a cooling system may be connected to the heat dissipation member (S160).

The method of FIG. 8 will be further described hereafter in relation to FIGS. 9A to 9F.

FIGS. 9A to 9F are related cross-sectional views further illustrating a method of manufacture for a semiconductor package and cooling system according to embodiments of the inventive concept.

Figure 9A:
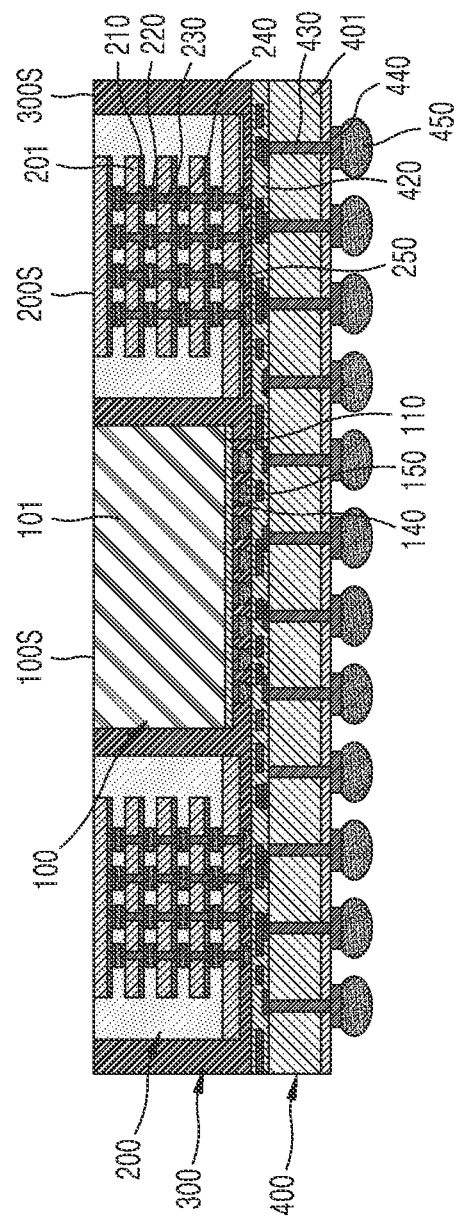
FIGS. 9A, 9B, 9C, 9D, 9E and 9F (hereafter collectively, "FIGS. 9A to 9F") are related cross-sectional views illustrating in one example a method of manufacture for a semiconductor package and a cooling system according to embodiments of the inventive concept.

Referring to FIG. 9A, the first and second semiconductor chips 100 and 200 may be mounted on the interposer 400.

Here, the first semiconductor chip 100 and the second semiconductor chip(s) 200 performing different functions may first be separately manufactured. Then, the manufactured first and second semiconductor chips 100 and 200 may be mounted on an upper portion of the interposer 400, and the molding member 300 may be formed to substantially surround the first and second semiconductor chips 100 and 200.

The molding member 300 may expose the upper surfaces 100S and 200S of the first and second semiconductor chips 100 and 200. Accordingly, the upper surface 300S of the molding member 300 and the upper surfaces 100S and 200S of the first and second semiconductor chips 100 and 200 may be coplanar.

The interposer 400 may serve to mechanically support and/or electrically connect the first semiconductor chip 100 and the second semiconductor chip(s) 200. The internal connection terminals 450 may be formed on a lower surface of the interposer 400.

Figure 9B:
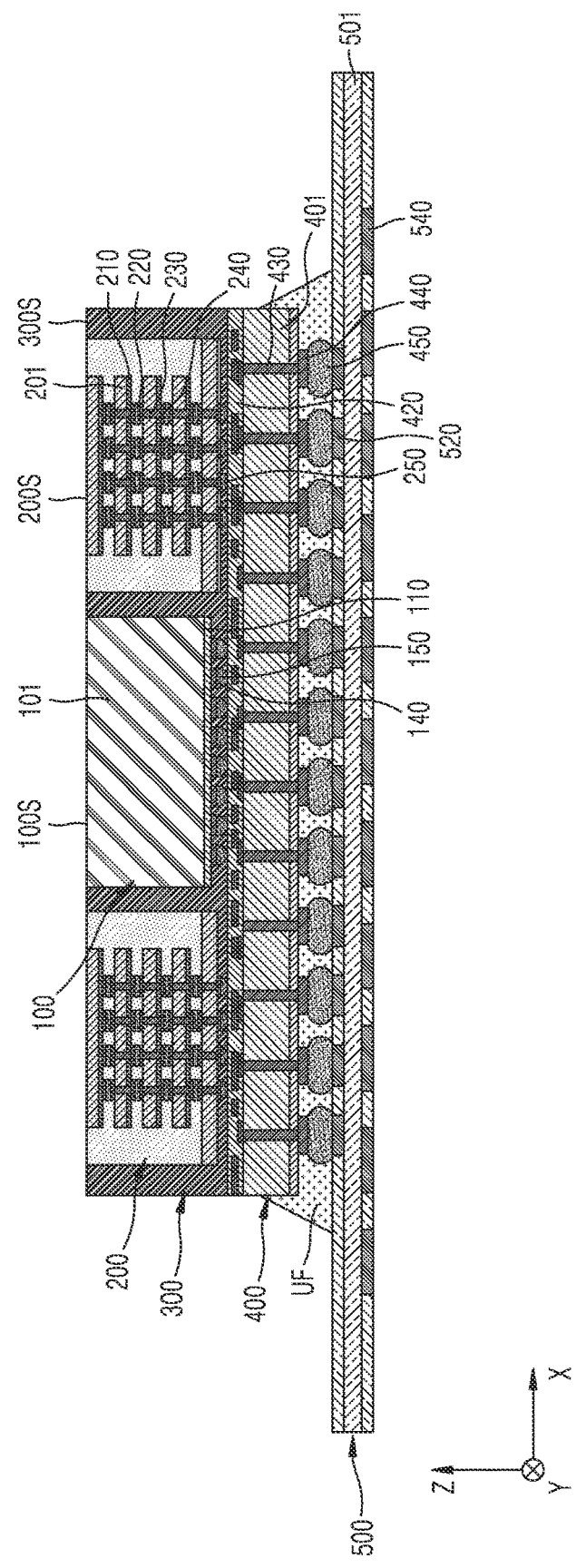

Referring to FIG. 9B, the interposer 400 including the first and second semiconductor chips 100 and 200 may be mounted on the package substrate 500 using the internal connection terminals 450 that may be variously connected to elements and/or components on an upper surface of the package substrate 500.

The underfill UF may then be formed between the interposer 400 and the package substrate 500, such that the underfill UF is interposed between the interposer 400 and the package substrate 500 and substantially surrounds the internal connection terminals 450.

Assuming that the package substrate 500 is a PCB, the body portion 501 may be implemented by compressing a polymer material such as a thermosetting resin, an epoxy resin such as flame retardant 4 (FR-4), bismaleimide triazine (BT), Ajinomoto build up film (ABF), or, a phenol resin, etc., to a certain thickness to form a thin shape, coating one or both surfaces with a copper foil, and then forming a wiring that is a transmission path of an electrical signal through patterning.

Here, the PCB may be divided into a single-sided PCB in which wiring is formed on only one side and a double-sided PCB in which wiring is formed on both sides. In addition, the copper foil may be formed in three or more layers by using a prepreg as an insulator, and three or more wirings may be formed according to the number of layers of the formed copper foil, and thus a PCB of a multilayer may be implemented.

Figure 9C:
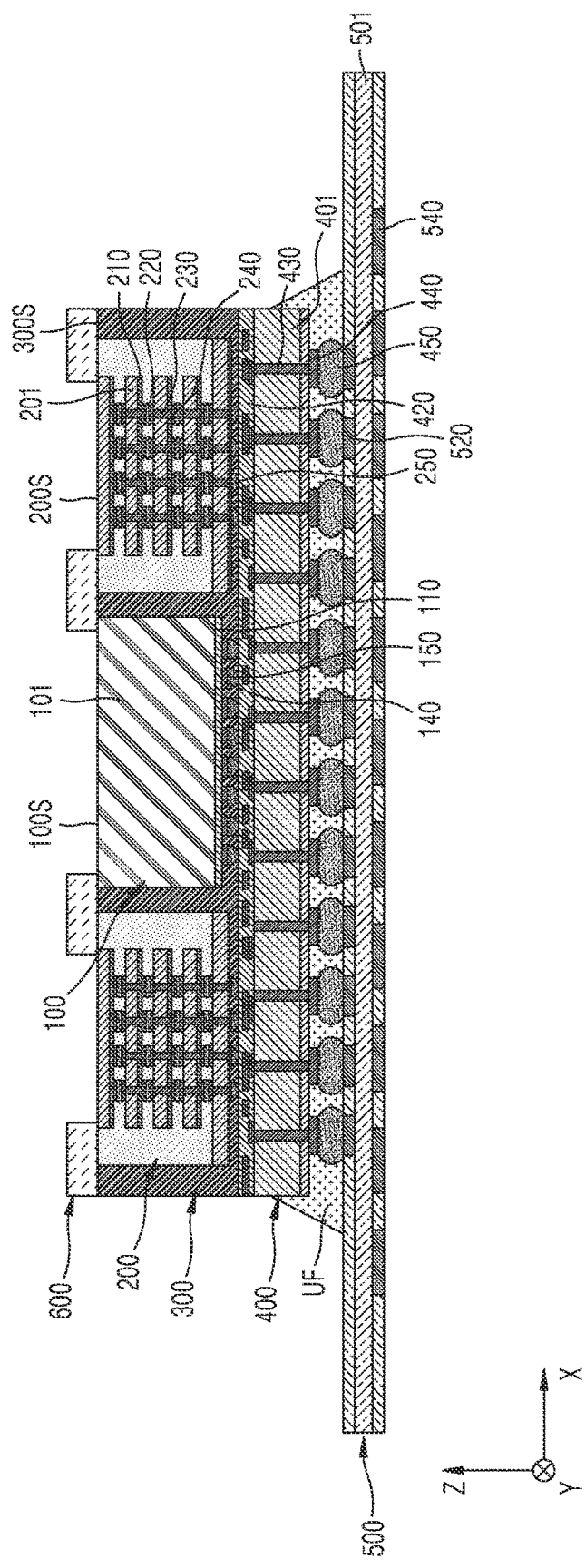

Referring to FIG. 9C, the sealing member 600 may be disposed on upper portions of the first and second semiconductor chips 100 and 200 and the molding member 300 surrounding the first and second semiconductor chips 100 and 200, to selectively expose the upper surfaces 100S and 200S of the first and second semiconductor chips 100 and 200.

The sealing member 600 may be disposed to seal an interface between the first and second semiconductor chips 100 and 200 and the molding member 300 in order to prevent infiltration of moisture or humidity.

The sealing member 600 may cover edge regions of the molding member 300 and the upper surfaces 100S and 200S of the first and second semiconductor chips 100 and 200, and a central region of the upper surfaces 100S and 200S may be exposed. In some embodiments, a sidewall of the sealing member 600 may be disposed to vertically align with a sidewall of the molding member 300.

The sealing member 600 may include an adhesive in order to be fixed to the first and second semiconductor chips 100 and 200 and the molding member 300 using the adhesive. Accordingly, sealing action of the sealing member 600 may be further enhanced.

Figure 9D:
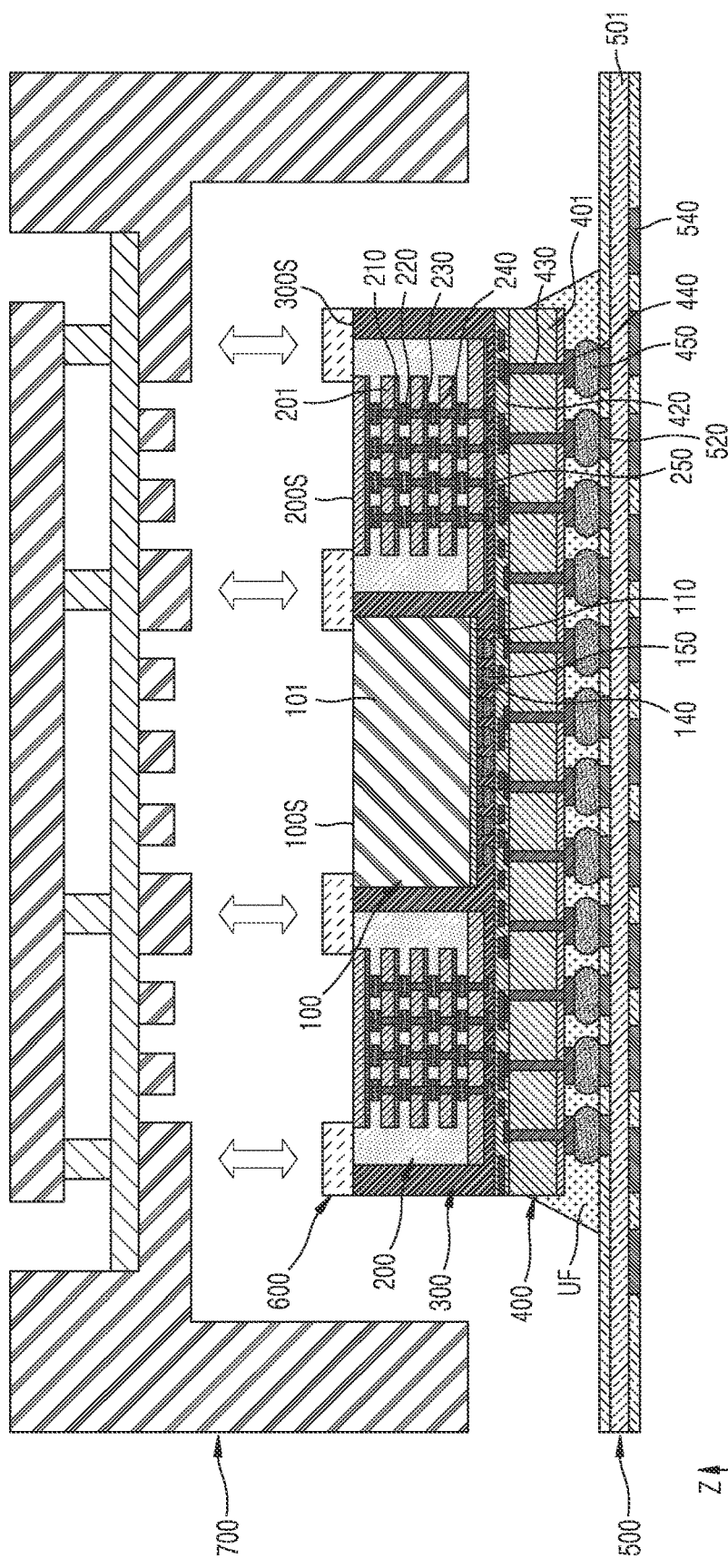

Referring to FIG. 9D, the heat dissipation member 700 may be disposed on an upper portion of the package substrate 500 to cover the first and second semiconductor chips 100 and 200.

The heat dissipation member 700 may include the lower structure 710 and the upper structure 720, wherein the lower structure 710 may constitute a unitary body with the upper structure 720 to support the upper structure 720. The upper structure 720 may be disposed at a certain position on the upper portions of the first and second semiconductor chips 100 and 200 by the lower structure 710.

The heat dissipation member 700 may include a material having high mechanical strength and high thermal conductivity. As such, the heat dissipation member 700 including the thermally conductive material may have a function of dissipating heat generated by the first and second semiconductor chips 100 and 200. In addition, the lower structure 710 and the upper structure 720 of the heat dissipation member 700 may include the same material and have a rectangular cylindrical shape, and the same material may be a metal material having corrosion resistance.

Figure 9E:
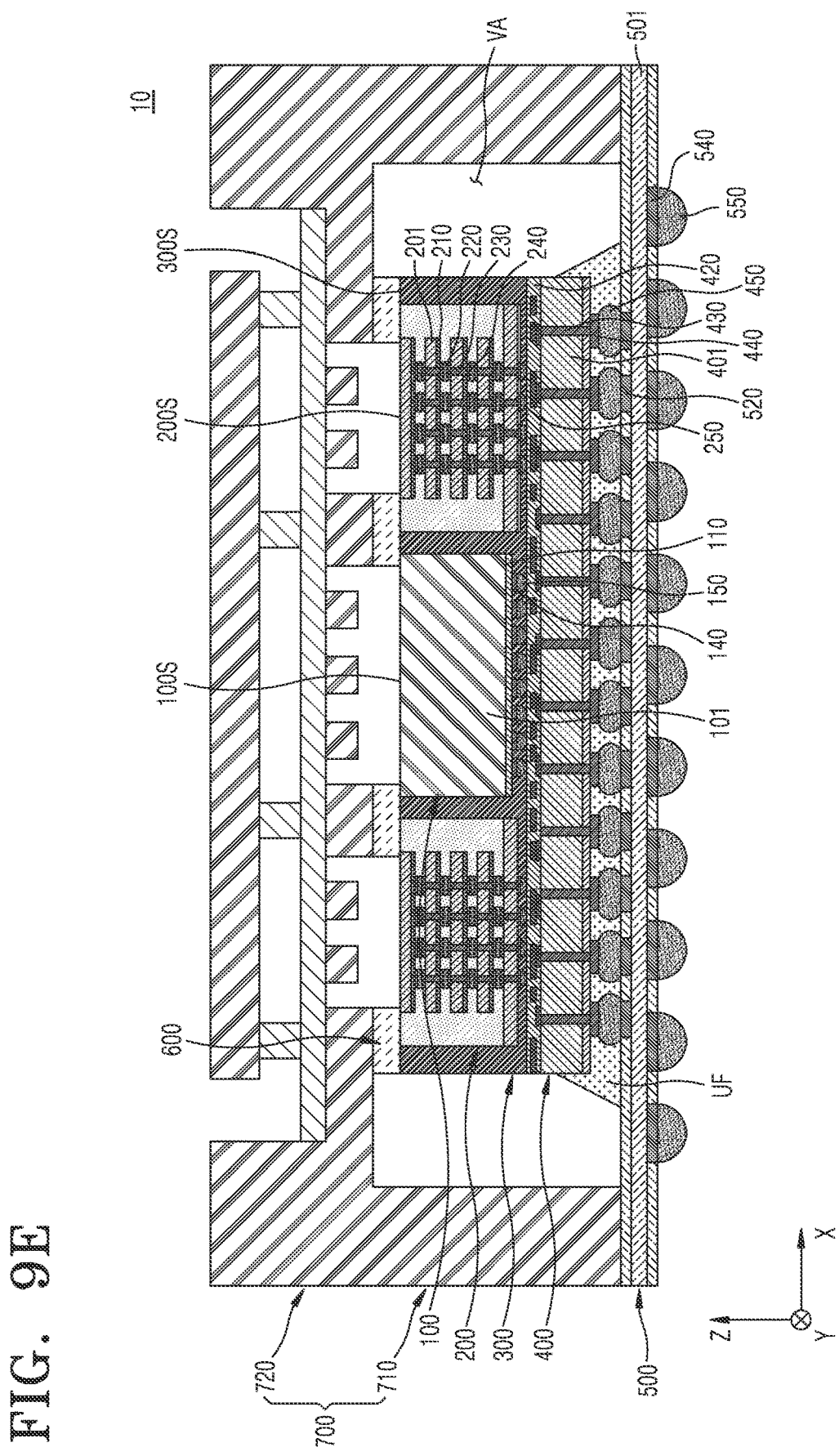

Referring to FIG. 9E, pressure may be applied to the heat dissipation member 700 so that the sealing member 600 and the heat dissipation member 700 firmly contact each other.

The heat dissipation member 700 may be spaced apart from the interposer 400 and the first and second semiconductor chips 100 and 200 to form a void (or empty space) VA, and may contact an upper surface of the sealing member 600.

The external connection terminal 550 may be attached to the bump pad 540 of the package substrate 500. The semiconductor package 10 may be mounted by being electrically connected to a main board 1010 (see FIG. 10) or a system board of an electronic device 1000 (see FIG. 10) which will be described below, through the external connection terminal 550.

Figure 9F:
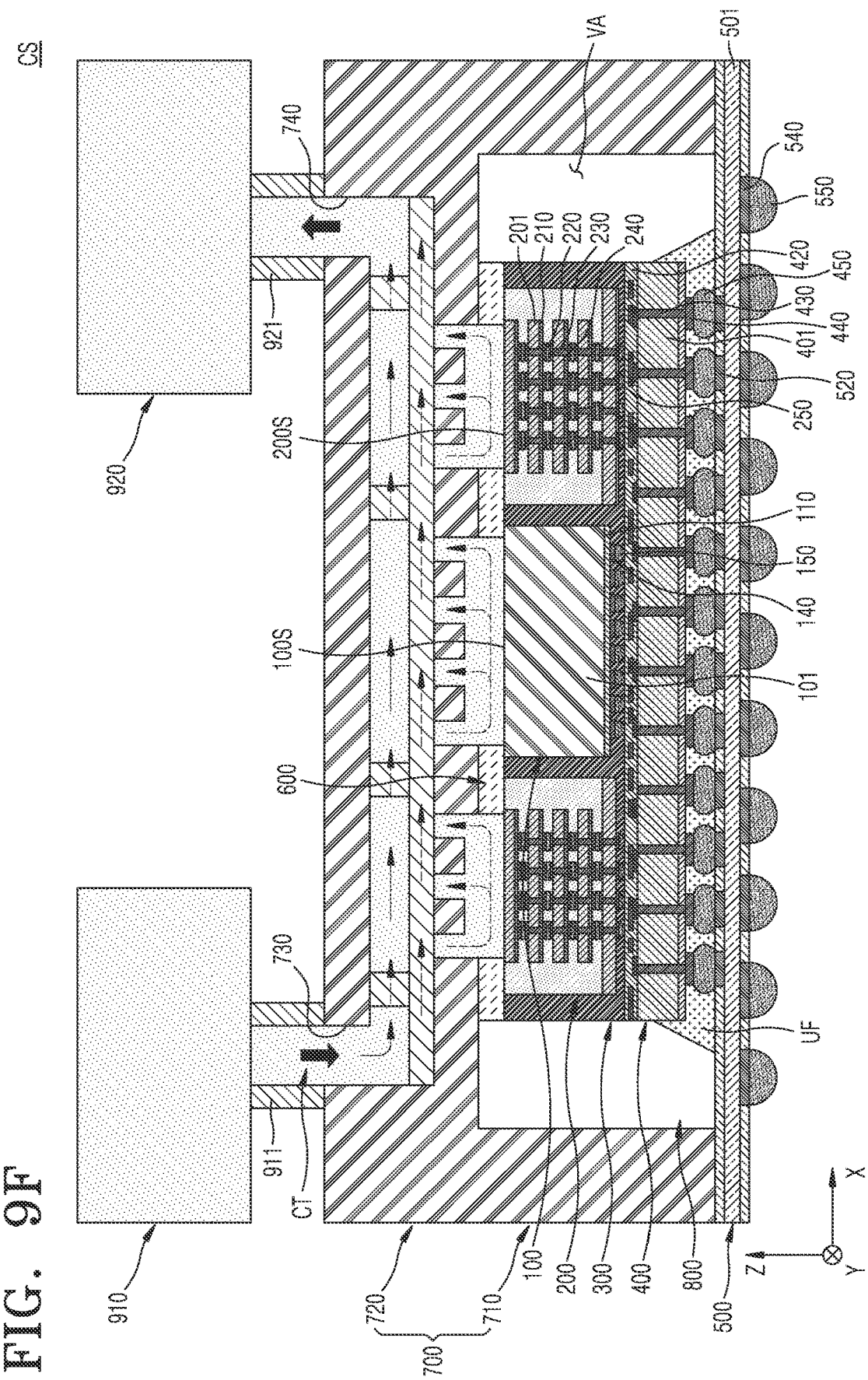

Referring to FIG. 9F, the cooling system CS may be disposed on the heat dissipation member 700.

The cooling system CS including the water cooling pump 910 and the heat dissipater 920 connected by a piping system may be disposed on an upper portion of the heat dissipation member 700. The first interface pipe 911 may be connected to the fluid inlet port 730, and the second interface pipe 921 may be connected to the fluid outlet port 740.

In FIG. 9F, the arrow indicates a fluid transfer (or flow) path for the coolant CT. The coolant CT may be pumped from the water cooling pump 910 into the semiconductor package 10 through the first interface pipe 911. After the coolant CT cools the semiconductor package 10, the coolant CT may enter the inside of the heat spreader 920 through the second interface pipe 921.

Figure 10:
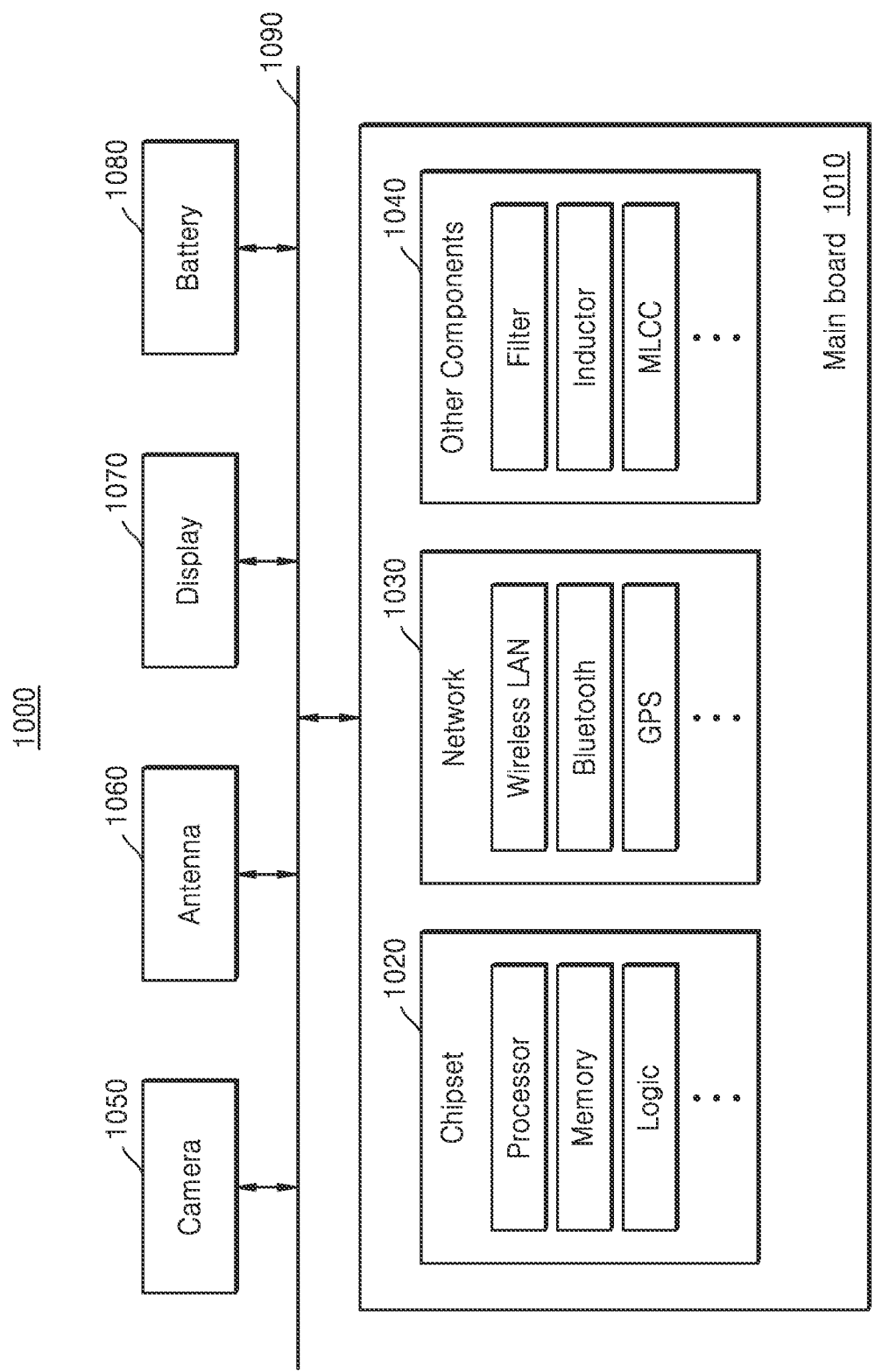
FIG. 10 is a block diagram illustrating an electronic device including a semiconductor package according to embodiments of the inventive concept.

FIG. 10 is a block diagram illustrating an electronic device 1000 including a semiconductor package according to embodiments of the inventive concept.

Referring to FIG. 10, the electronic device 1000 may accommodate a main board 1010. A chipset 1020, a network 1030, and other components 1040 may be physically and/or electrically connected to the main board 1010. The chipset 1020, the network 1030, and the other components 1040 may be combined with other electronic components which will be described below to form various signal lines 1090.

The chipset 1020 may include a memory chip such as a volatile memory, a non-volatile memory, and a flash memory, an application processor chip such as a central processor, a graphic processor, a digital signal processor, an encryption processor, a microprocessor, and a microcontroller, an analog-to-digital converter, a logic chip such as an application-specific IC (ASIC), etc. In addition, other types of chip-related electronic components may be included. Also, these chipsets 1020 may be combined with each other.

The network 1030 may include WiFi (IEEE 802.11 family, etc.), WiMAX (IEEE 802.16 family, etc.), IEEE 802.20, long term evolution (LTE), Ev-DO, HSPA+, HSDPA+, HSUPA+, EDGE, GSM, GPS, GPRS, CDMA, TDMA, DECT, Bluetooth, 3G, 4G, 5G, and any other wired or wireless protocols as designated thereafter. In addition, any of numerous other wired and wireless standards or protocols may be included. Also, the network 1030 may be combined with the chipset 1020.

The other components 1040 may include a high frequency inductor, a ferrite inductor, a power inductor, ferrite beads, low temperature co-firing ceramics (LTCC), an electro magnetic interference (EMI) filter, a multi-layer ceramic condenser (MLCC), etc. In addition, passive components used for various other purposes may be included. Additionally, the other components 1040 may be combined with the chipset 1020 and/or the network 1030.

According to a type of the electronic device 1000, the electronic device 1000 may include other electronic components that may or may not be physically and/or electrically connected to the main board 1010. The other electronic components may include, for example, a camera 1050, an antenna 1060, a display 1070, a battery 1080, audio codec (not shown), video codec (not shown), a power amplifier (not shown), a compass (not shown), an accelerometer (not shown), a gyroscope (not shown), a speaker (not shown), a mass storage device (not shown), a compact disk (CD) (not shown), and a digital versatile disk (DVD) (not shown), etc. In addition, electronic components used for various purposes may be included according to the type of the electronic device 1000.

The electronic device 1000 may include a smart phone, a personal digital assistant, a digital video camera, a digital still camera, a network system, and a computer, a monitor, a tablet, a laptop, a netbook, a television, a video game, a smart watch, etc. In addition, the electronic device 1000 may be any other electronic device that processes data.

The semiconductor packages 10, 20, 30, 40, and 50 according to embodiments of the inventive concept described above with reference to FIGS. 1A to 5 may be applied to the electronic device 1000 for various purposes as described above.

Figure 11:
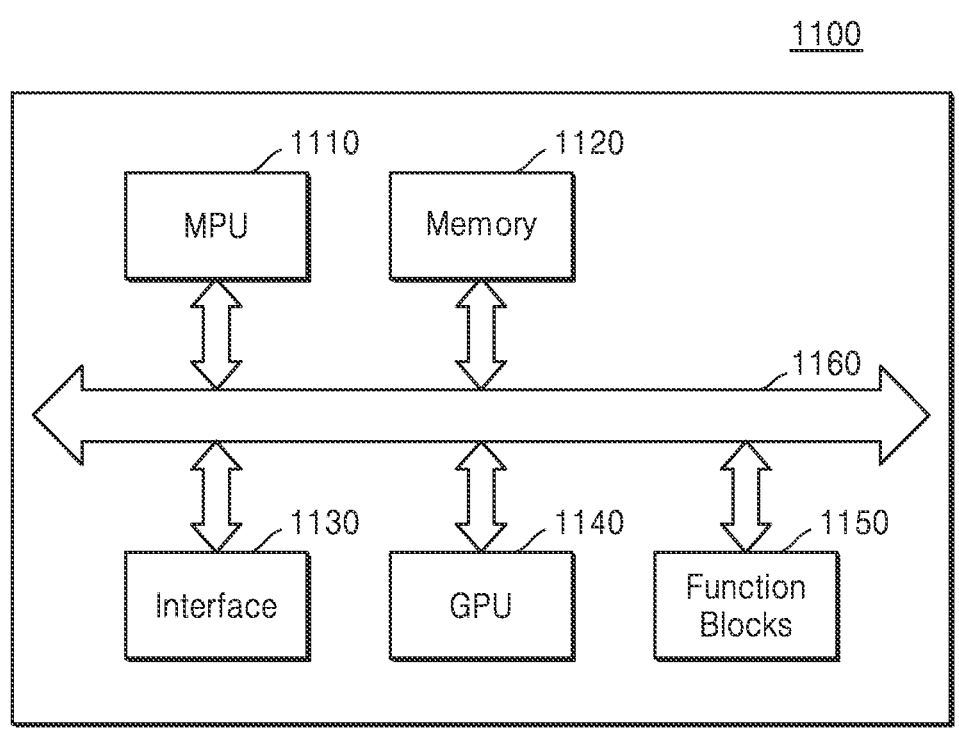
FIG. 11 is a block diagram illustrating a semiconductor package according to embodiments of the inventive concept.

FIG. 11 is a block diagram illustrating a semiconductor package 1100 according to embodiments of the inventive concept.

Referring to FIG. 11, the semiconductor package 1100 may include a microprocessor unit (MPU) 1110, a memory 1120, an interface 1130, a graphic processing unit (GPU) 1140, function blocks 1150, and a bus 1160 connecting the MPU 1110, the memory 1120, the interface 1130, the GPU 1140, and the function blocks 1150.

The semiconductor package 1100 may include both the MPU 1110 and the GPU 1140, or may include only one of the two.

The MPU 1110 may include a core and a cache. For example, the MPU 1110 may include a multi-core. Each core of the multi-core may have the same or different performance. In addition, each core of the multi-core may be activated at the same time or may be activated at different times.

The memory 1120 may store a result of processing performed by the function blocks 1150 under the control of the MPU 1110. The interface 1130 may exchange information or signals with external devices. The GPU 1140 may perform graphic functions. For example, the GPU 1140 may perform video codec or process 3D graphic. The function blocks 1150 may perform various functions. For example, when the semiconductor package 1100 is an application processor used in a mobile device, some of the function blocks 1150 may perform a communication function.

The semiconductor package 1100 may include any one of the semiconductor packages 10, 20, 30, 40, and 50 according to the embodiments of the inventive concept described above with reference to FIGS. 1A to 5.

While the inventive concept has been particularly shown and described with reference to embodiments thereof, it will be understood that various changes in form and details may be made therein without departing from the spirit and scope of the following claims.

What is claimed is:

1. A semiconductor package comprising:
a package substrate;
an interposer disposed on the package substrate;
semiconductor chips mounted on the interposer;
a molding member on the interposer and surrounding the semiconductor chips;
a first sealing member on the molding member; and
a heat dissipation member on the package substrate and covering the interposer, the semiconductor chips, and the first sealing member,
wherein the heat dissipation member includes:
a lower structure contacting an upper surface of the package substrate, and
an upper structure on the lower structure, extending over the first sealing member, and including a microchannel and a micropillar on the microchannel, and
wherein the first sealing member extends along an interface between the semiconductor chips and the molding member.

2. The semiconductor package of claim 1, wherein the first sealing member covers an upper surface of the molding member, covers outer edges of the semiconductor chips, and exposes respective central regions of upper surfaces of the semiconductor chips.

3. The semiconductor package of claim 1, wherein the lower structure and the upper structure of the heat dissipation member include a same material providing corrosion resistance and constitute a unitary body having a rectangular cylindrical shape.

4. The semiconductor package of claim 3, wherein the lower structure vertically supports the upper structure and is laterally spaced apart from the interposer and the semiconductor chips.

5. The semiconductor package of claim 3, wherein a thickness of the upper structure is in a ranges from about 1 μm to about 2,000 μm, and a thickness of the first sealing member is in a range from about 1 μm to about 300 μm.

6. The semiconductor package of claim 1, wherein the microchannel includes a lower microchannel extending in a first horizontal direction, and an upper microchannel extending in a second horizontal direction crossing the first horizontal direction.

7. The semiconductor package of claim 6, wherein the upper structure includes a fluid inlet port and a fluid outlet port,
the fluid inlet port, the upper microchannel, the lower microchannel, and the fluid outlet port are interconnected to form a cooling space, and
the cooling space is thermally connected to respective upper surfaces of the semiconductor chips.

8. The semiconductor package of claim 1, wherein the semiconductor chips include a first semiconductor chip performing a first function and a plurality of second semiconductor chips, each performing a second function different from the first function,
an upper surface of the first semiconductor chip and upper surfaces of the plurality of second semiconductor chips are coplanar, and
second semiconductor chips among the plurality of second semiconductor chips are arranged laterally around the first semiconductor chip.

9. The semiconductor package of claim 1, further comprising:
a second sealing member between an inner sidewall of the lower structure of the heat dissipation member and an outer sidewall of the molding member and an outer edge of the package substrate.

10. A semiconductor package comprising:
a first semiconductor chip and a second semiconductor chip mounted on an interposer, wherein each of the first semiconductor chip and the second semiconductor chip includes an active surface and an inactive surface;
a molding member on the interposer and surrounding the first semiconductor chip and the second semiconductor chip;
a sealing member on an upper surface of the molding member, disposed along an edge of an inactive surface of the first semiconductor chip, disposed along an edge of an inactive surface of the second semiconductor chip, exposing a first central region of the inactive surface of the first semiconductor chip, and exposing a second central region of the inactive surface of the second semiconductor chip; and
a heat dissipation member on the sealing member, covering the molding member, the first semiconductor chip, and the second semiconductor chip, and including a coolant transfer path thermally connected to the first central region and the second central region, wherein the coolant transfer path includes at least one of a microchannel and a micropillar.

11. The semiconductor package of claim 10, wherein the sealing member is disposed along an interface between the molding member and the first semiconductor chip and along an interface between the molding member and the second semiconductor chip.

12. The semiconductor package of claim 11, wherein an outer sidewall of the molding member and an outer sidewall of the sealing member are vertically aligned.

13. The semiconductor package of claim 10, wherein the sealing member includes an adhesive and waterproof material.

14. The semiconductor package of claim 13, wherein a lower surface of the sealing member is adhered to an upper surface of the first semiconductor chip and an upper surface of the second semiconductor chip through the adhesive, and an upper surface of the sealing member is adhered to a lower surface of the heat dissipation member.

15. A semiconductor package, comprising:
a package substrate;
an interposer disposed on the package substrate;
semiconductor chips mounted on the interposer;
a molding member on the interposer and surrounding the semiconductor chips;
a sealing member extending along an interface between the molding member and the semiconductor chips; and
a heat dissipation member on the package substrate, connected to a cooling system, and covering the interposer, the semiconductor chips, and the sealing member,
wherein the heat dissipation member includes:
a coolant inlet port exposed through an upper surface of the heat dissipation member;
a coolant outlet port exposed through the upper surface of the heat dissipation member; and
a coolant transfer path extending between the coolant inlet port and the coolant outlet port and configured to thermally connect a coolant to central portions of respective upper surfaces of the semiconductor chips.

16. The semiconductor package of claim 15, wherein the coolant transfer path includes at least one of a microchannel and a micropillar, and the coolant includes ultrapure water.

17. The semiconductor package of claim 16, wherein the coolant transfer path includes the microchannel and the micropillar disposed on the microchannel.

18. The semiconductor package of claim 15, wherein the cooling system includes a water cooling pump connected to the coolant inlet port and a heat dissipater connected to the coolant outlet port.

19. The semiconductor package of claim 15, further comprising: at least one coating layer on the respective upper surfaces of the semiconductor chips,
wherein the coolant directly contacts the at least one coating layer.

* * * * *